United States Patent [19]
Nishizawa et al.

[11] Patent Number: 5,468,989
[45] Date of Patent: Nov. 21, 1995

[54] SEMICONDUCTOR INTEGRATED CIRCUIT DEVICE HAVING AN IMPROVED VERTICAL BIPOLAR TRANSISTOR STRUCTURE

[75] Inventors: Hirotaka Nishizawa; Seiichiro Azuma, both of Akishima; Kazuaki Ootoshi, Ohme; Masataka Miyama, Fuchu; Shuji Kawata, Ohme; Osamu Kasahara, Hinode; Sinichi Suzuki, Ohme, all of Japan

[73] Assignees: Hitachi, Ltd., Tokyo; Hitachi VLSI Engineering Corp., Kodaira, both of Japan

[21] Appl. No.: 963,926

[22] Filed: Oct. 20, 1992

Related U.S. Application Data

[63] Continuation of Ser. No. 552,519, Jul. 16, 1990, abandoned, which is a continuation-in-part of Ser. No. 360,119, May 31, 1989, abandoned.

[30] Foreign Application Priority Data

Jun. 2, 1988 [JP] Japan .................................. 63-136097
Jul. 14, 1989 [JP] Japan .................................. 1-182265

[51] Int. Cl.$^6$ ................................................. H01L 29/72
[52] U.S. Cl. ........................... 257/517; 257/518; 257/593
[58] Field of Search ................................. 357/55, 34, 59, 357/43; 257/517, 518, 526, 554, 587, 588, 592, 552, 593

[56] References Cited

U.S. PATENT DOCUMENTS

| 4,546,536 | 10/1985 | Anantha et al. | 257/518 |
|---|---|---|---|
| 4,654,687 | 3/1987 | Hébert | 257/552 |
| 4,825,274 | 4/1989 | Higuchi et al. | 357/43 |
| 4,908,324 | 3/1990 | Nihira et al. | 357/34 |
| 4,920,401 | 4/1990 | Sakai et al. | 357/59 |
| 4,984,053 | 1/1991 | Kayanuma | 257/518 |

FOREIGN PATENT DOCUMENTS

| 0172327 | 2/1986 | European Pat. Off. | 357/43 |
|---|---|---|---|
| 61-91960 | 5/1986 | Japan | 257/592 |

OTHER PUBLICATIONS

Bechade et al., "Lateral PNP Transistor," IBM Technical Disclosure Bulletin, vol. 15 No. 12, May 1973, p. 3790.
Nikkei Electronics, Mar. 29, 1982, pp. 94–96 and English translation thereof.

Primary Examiner—Sara W. Crane
Assistant Examiner—Courtney A. Bowers
Attorney, Agent, or Firm—Antonelli, Terry, Stout & Kraus

[57] ABSTRACT

There is provided a semiconductor integrated circuit device having bipolar transistors each composed of an emitter region, base region, and collector region arranged vertically on a semiconductor substrate, said collector region having a plane figure, with the square corners thereof cut off. To be concrete, the buried collector region having a high concentration of impurity has its square corners cut off and the base region formed on the major surface of the epitaxial layer formed on said buried collector region has also its square corners cut off. The bipolar transistor having such a plane figure has a reduced parasitic capacity and an increased operating speed. A manufacturing method is also provided capable of producing a highly reliable groove isolation structure with a low dielectric constant.

7 Claims, 22 Drawing Sheets

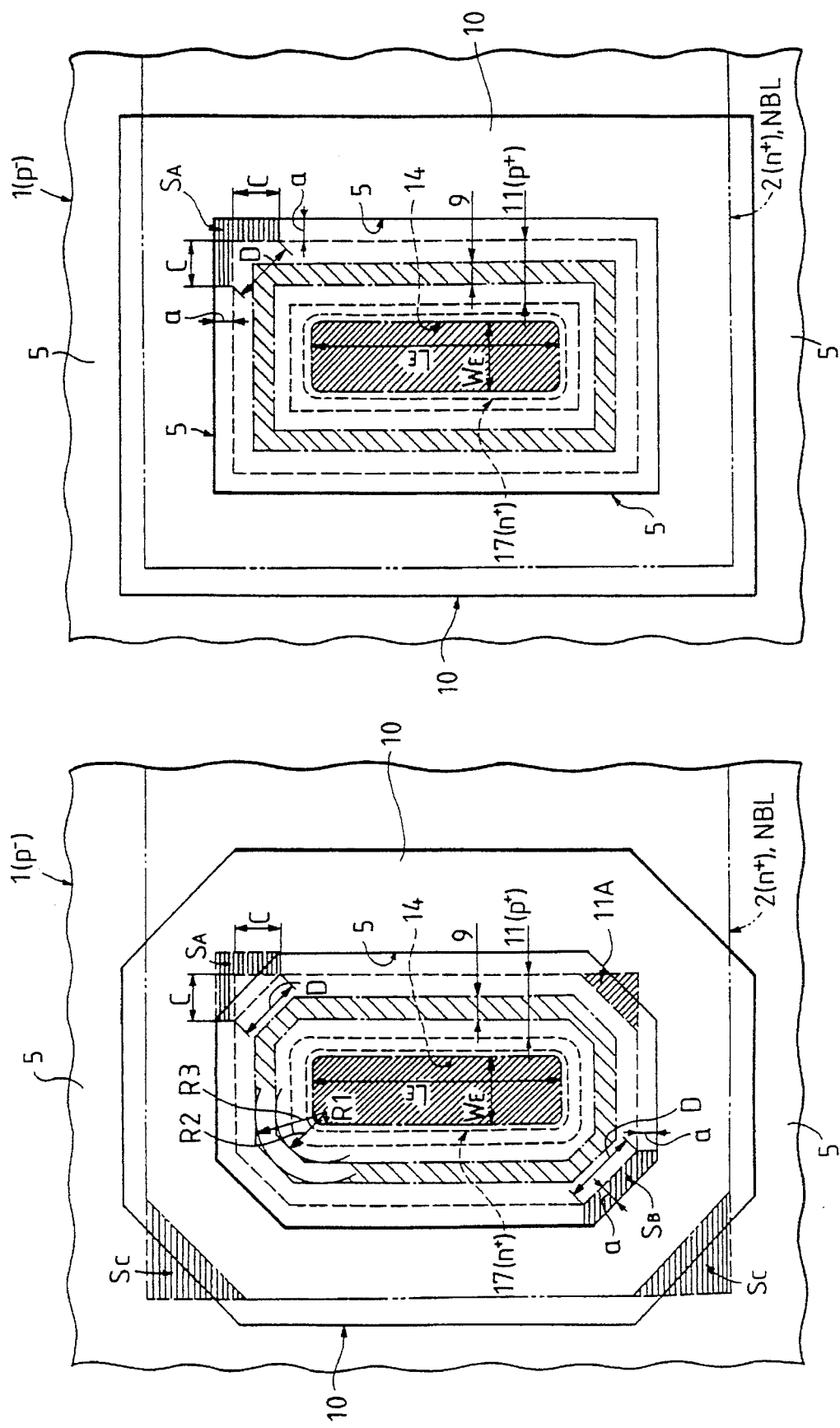

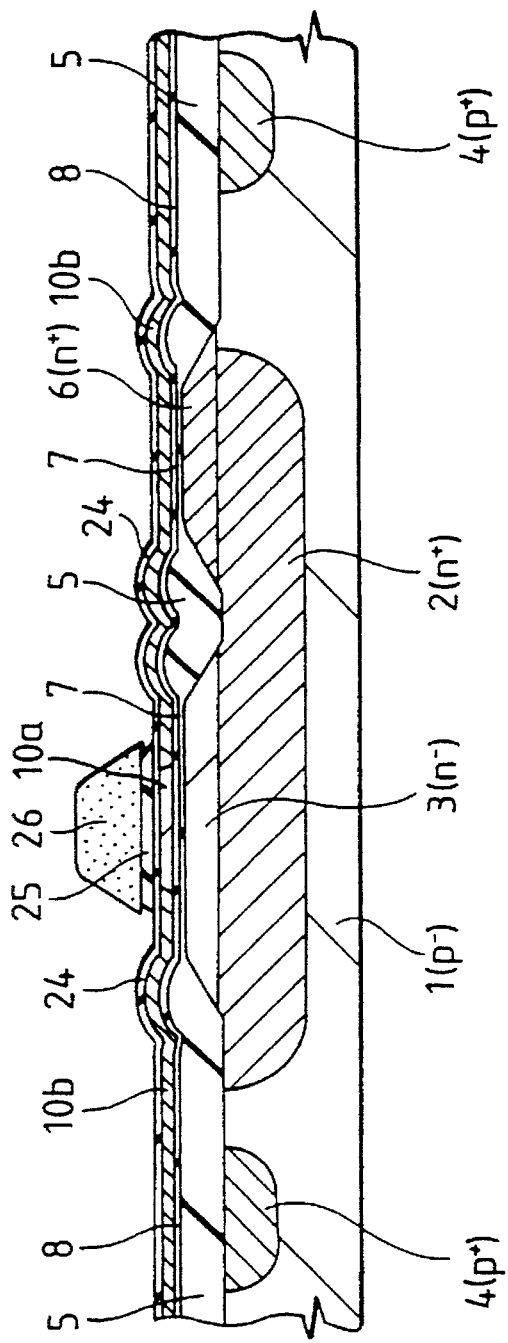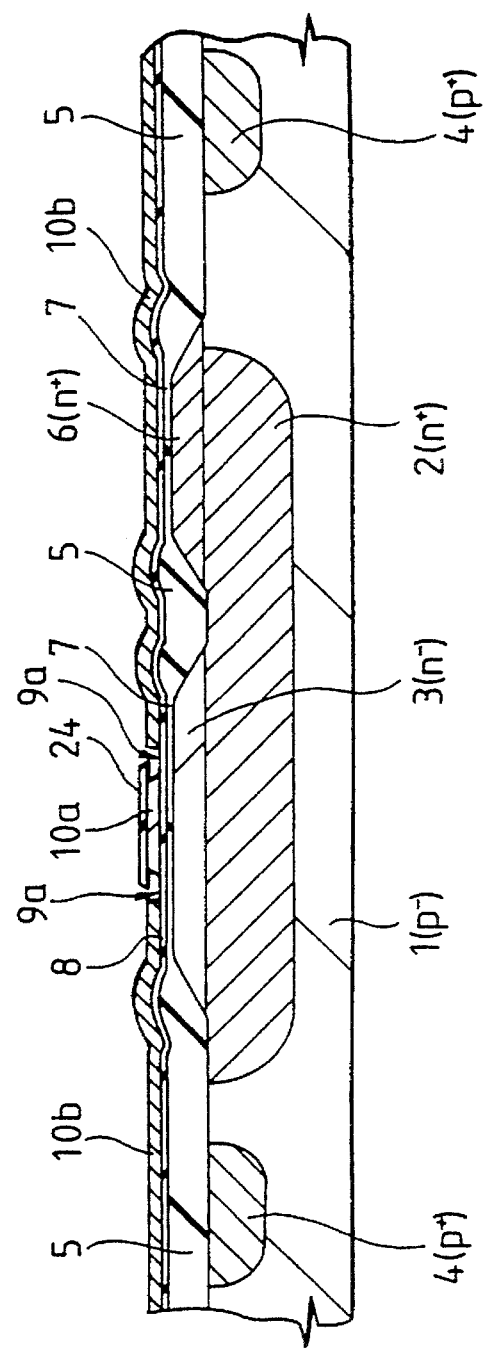
FIG. 9
FIG. 10

SEMICONDUCTOR INTEGRATED CIRCUIT DEVICE HAVING AN IMPROVED VERTICAL BIPOLAR TRANSISTOR STRUCTURE

This application is a continuation of application Ser. No. 552,519, filed on Jul. 16, 190, abandoned; which is a continuation-in-part of application Ser. No. 360,119 filed on May 31, 1989, abandoned.

BACKGROUND OF THE INVENTION

The present invention relates to a semiconductor integrated circuit device, and more particularly, it is concerned with a technology which can be effectively applied to the semiconductor integrated circuit device having bipolar transistors of vertical structure.

The bipolar transistor under development by the present inventors is formed on the basis of the Selective Etching Poly-silicon Technology structure (acronymically abbreviated as SEPT structure hereinafter). According to this technology, it is possible to form the base lead-out electrode, emitter opening, emitter region, emitter lead-out electrode, and base-to-emitter separation distance by means of self-alignment to the base region (or contact region for base lead-out). In other words, this technology makes it possible to form highly integrated bipolar transistors because it minimizes the inaccurate placement of the mask in the fabrication process.

The bipolar transistor of SEPT structure is made up of, for example, an n-type epitaxial layer formed on the major surface of a p-type semiconductor substrate and operational regions (including an n-type emitter region, p-type base region, and n-type collector region (n-type epitaxial region)) which are formed in consecutive order vertically in the depth direction from the major surface of said n-type epitaxial layer.

The n-type collector region has a low-impurity concentration collector region of said n-type epitaxial layer and a high-impurity concentration n-type semiconductor region (buried collector region) which is formed as if it were buried between said p-type semiconductor substrate and n-type epitaxial layer. This buried collector region decreases the collector serial resistance when the collector potential is raised from the major surface of the n-type epitaxial layer.

The p-type base region is formed in the major surface of said epitaxial layer on the n-type collector region. The p-type base region is formed in the region defined by a thick isolating film to isolate elements from one another which is formed in the major surface of said epitaxial layer. The p-type base region is positioned a certain distance away from said isolating film which is equivalent to the displacement of the mask that occurs in the fabricating process. The p-type base region is made up of an intrinsic base region and a graft base region which is electrically connected to said intrinsic base region and surrounds said intrinsic base region. To the graft base region is connected one end of the base lead-out electrode (the inside of the base lead-out electrode) by self-alignment technique, and the other end of the base lead-out electrode (the outside of the base lead-out electrode) extends over said isolating film to isolate elements from one another. This structure is characteristic of those devices of SEPT structure and SST (Super Self-aligned Transistor) in which the base region and base lead-out electrode are formed by self-alignment technique or the base region and emitter region are formed by self-alignment technique.

The n-type emitter region is formed on the major surface of said intrinsic base region. The n-type emitter region is formed in the region surrounded by one end of the base lead-out electrode and is self-aligned to the base lead-out electrode. To this n-type emitter region is connected the emitter lead-out electrode by self-alignment technique.

The n-type emitter region of said bipolar transistor of SEPT structure has a rectangular plane figure, with the emitter width being shorter and the emitter length being longer, so that the current density is increased and the base resistance is decreased. Therefore, the p-type base region and n-type collector region each also has a rectangular plane figure in conformity with the plane figure of said n-type emitter region.

Incidentally, the bipolar transistor of SEPT structure is described in, for example, Japanese Patent Publication No. 7398/1976.

SUMMARY OF THE INVENTION

In the course of the development of said bipolar transistor of SEPT structure, the present inventors found the following problems.

The bipolar transistor of SEPT structure is constructed such that the n-type emitter region is surrounded by the p-type base region, which is further surrounded by the n-type collector region. The outermost n-type collector region (actually a buried collector region) has a considerably large plane figure. Moreover, the buried collector region is heavily doped. This leads to an increase in the area of the pn-junction between the n-type collector region and the p-type semiconductor substrate (and/or the isolation region formed by the high-impurity concentration p-type semiconductor region), which in turn increases the parasitic capacity $C_{TS}$ (collector-substrate capacity) formed at the pn-junction of the two. As the result, the bipolar transistor of SEPT structure becomes deteriorated in frequency characteristics and becomes lower in operating speed.

In addition, the bipolar transistor of SEPT structure has such a unique structure that the base lead-out electrode extends over the isolation (or insulating) film for electrically isolating between semiconductor elements to be formed. Thus, there is formed a part in which the n-type collector region (actually a low-impurity concentration collector region which is an n-type epitaxial layer) between the element isolation region and the graft base region overlaps with the base lead-out electrode, with a thin isolation film interposed between them. This overlapping part forms the MIS (Metal-Insulator-Semiconductor) capacity attributable to the n-type collector region (semiconductor), isolation film (insulator), and base lead-out electrode (metal) laminated on top of the other, thereby increasing the parasitic capacity (base-collector capacity) $C_{TC}$. As the result, the bipolar transistor of SEPT structure becomes deteriorated in frequency characteristics and becomes lower in operating speed. This parasitic capacity $C_{TC}$ is further increased by the addition of the parasitic capacity $C_{TC}$ resulting from the pn-junction between the p-type base region and the n-type collector region surrounding it (actually a low-impurity concentration collector region which is an n-type epitaxial layer).

It is an object of the present invention to provide a technique which makes it possible to lower the parasitic capacity, thereby improving the frequency characteristics and increasing the operating speed of the semiconductor integrated circuit device having bipolar transistors.

It is another object of the present invention to provide a technique which makes it possible to lower the parasitic capacity $C_{TS}$ formed between the collector and substrate of the bipolar transistor, thereby achieving the above-mentioned object.

It is another object of the present invention to provide a technique which makes it possible to lower the parasitic capacity $C_{TC}$ formed between the base and collector of the bipolar transistor, thereby achieving the above-mentioned object.

It is another object of the present invention to provide a technique which makes it possible to lower the MIS capacity ($C_{TC}$) formed between the collector region and base lead-out electrode in the bipolar transistor in which the base lead-out electrode is connected to the base region by self-alignment technique, thereby achieving the above-mentioned object.

Yet another object of the present invention is to provide a manufacturing method for semiconductor integrated circuit devices capable of producing a highly reliable groove isolation structure with a low dielectric constant.

These and other objects and features of the invention will be apparent from the following description and appended drawings.

The typical aspects of the invention disclosed herein are briefly described in the following.

A bipolar transistor of vertical structure having a buried collector region (or an emitter region in the case of inverse transistor) between the semiconductor substrate of a first conductivity type and the low-impurity concentration collector region of a second conductivity type (which is opposite to the first conductivity type mentioned above) formed on said semiconductor substrate, wherein said buried collector region has a plane figure, with the square corners thereof cut off.

A semiconductor integrated circuit device having bipolar transistors of vertical structure, each having the second operational region (base region) of a first conductivity type in the region surrounded by the element separating isolation film of square figure, said region being the major surface of the first operational region of the transistor composed of said buried collector region and the low-impurity concentration collector region, and also having the lead-out electrode connected to the second operational region, said lead-out electrode extending over said element separating isolation film, wherein the element separating isolation film surrounding said second operational region has a plane figure, with the square corners thereof cut off.

A semiconductor integrated circuit device having bipolar transistors of vertical structure, each having the second operational region which has a square plane figure, wherein the second operational region is formed such that the corners thereof are cut off.

According to the above-mentioned means, the peripheral length of the buried collector region is reduced and the area of the pn-junction between the buried collector region and the semiconductor substrate is reduced. Therefore, the parasitic capacity formed between the buried collector region and the semiconductor substrate is reduced, with the result that the operating speed of the bipolar transistor of vertical structure can be increased.

Moreover, the present invention makes it possible to reduce the overlapping area for the first operational region and said lead-out electrode which corresponds to the mask placement allowance for said element separating isolation film and the second operational region. As the result, the MIS capacity formed by said first operational region of semiconductor and said lead-out electrode of metal is reduced, and hence the operating speed of the bipolar transistor of vertical structure can be increased.

In addition, according to the present invention, the peripheral length of said second operational region is reduced and the area of the pn-junction between the second operational region and the first operational region is reduced. This leads to the reduction of the parasitic capacity formed between the second operational region and the first operational region, with the result that the operating speed of the bipolar transistor of vertical structure can be increased.

BRIEF DESCRIPTION OF THE DRAWINGS

FIG. 3 is a plan view showing the effective regions for transistor operation of said bipolar transistor formed in the prescribed fabricating process.

FIG. 4 is a plan view showing the effective region for transistor operation of the bipolar transistor which had been investigated before the present inventors developed the bipolar transistor of the present invention.

FIGS. 5 to 20 are sectional views showing important parts in the steps of fabricating the bipolar transistor shown in FIGS. 1 to 3.

DESCRIPTION OF THE PREFERRED EMBODIMENTS

Figure 1:
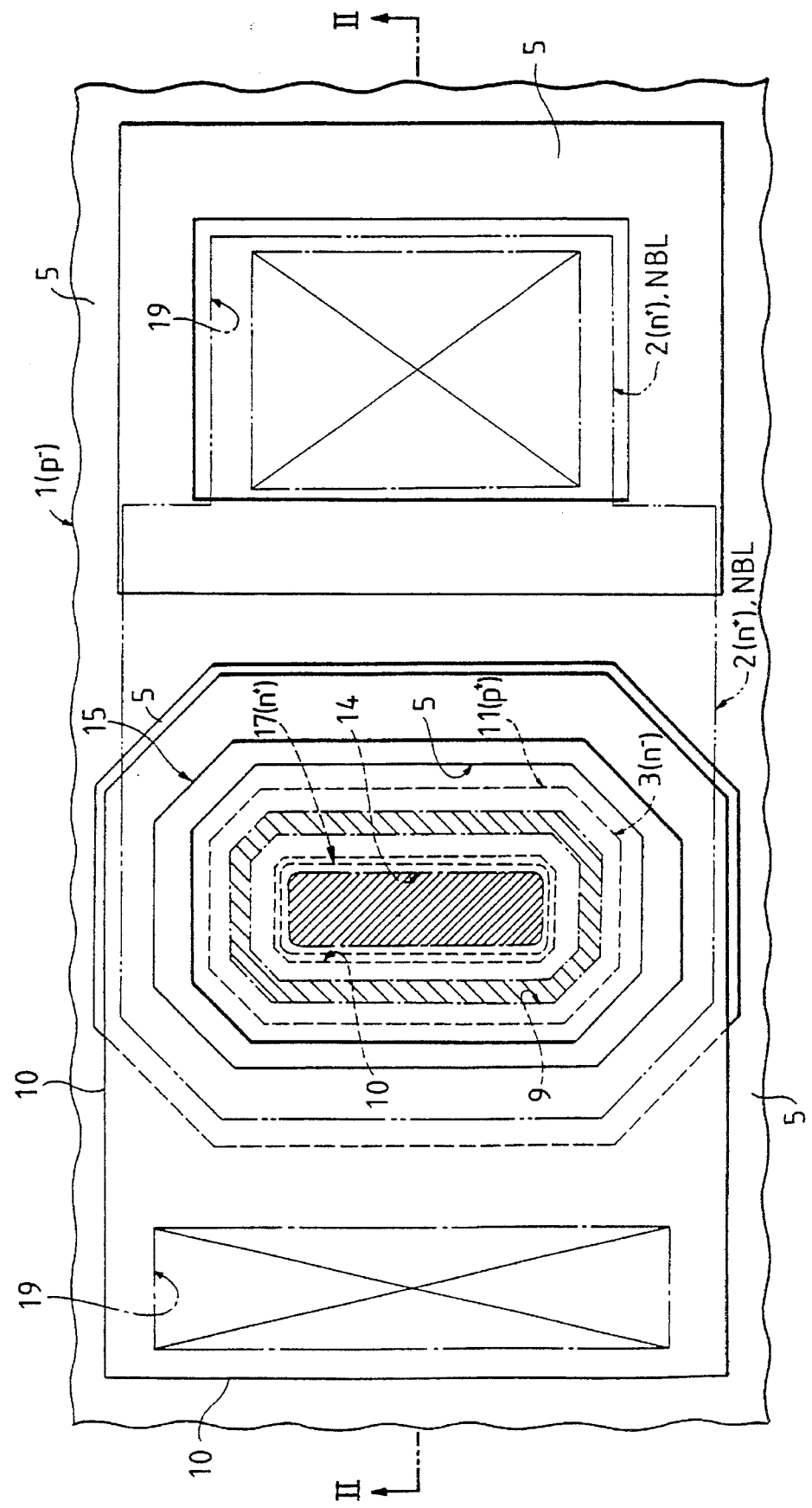
FIG. 1 is a plan view showing the construction of the bipolar transistor of SEPT structure pertaining to the embodiment of the present invention.

The invention will be described with reference to an embodiment in which the invention is applied to the semiconductor integrated circuit device having bipolar transistors of SEPT structure. Incidentally, like reference characters designate corresponding parts throughout the figures used for the explanation of the embodiment.

Figure 2:
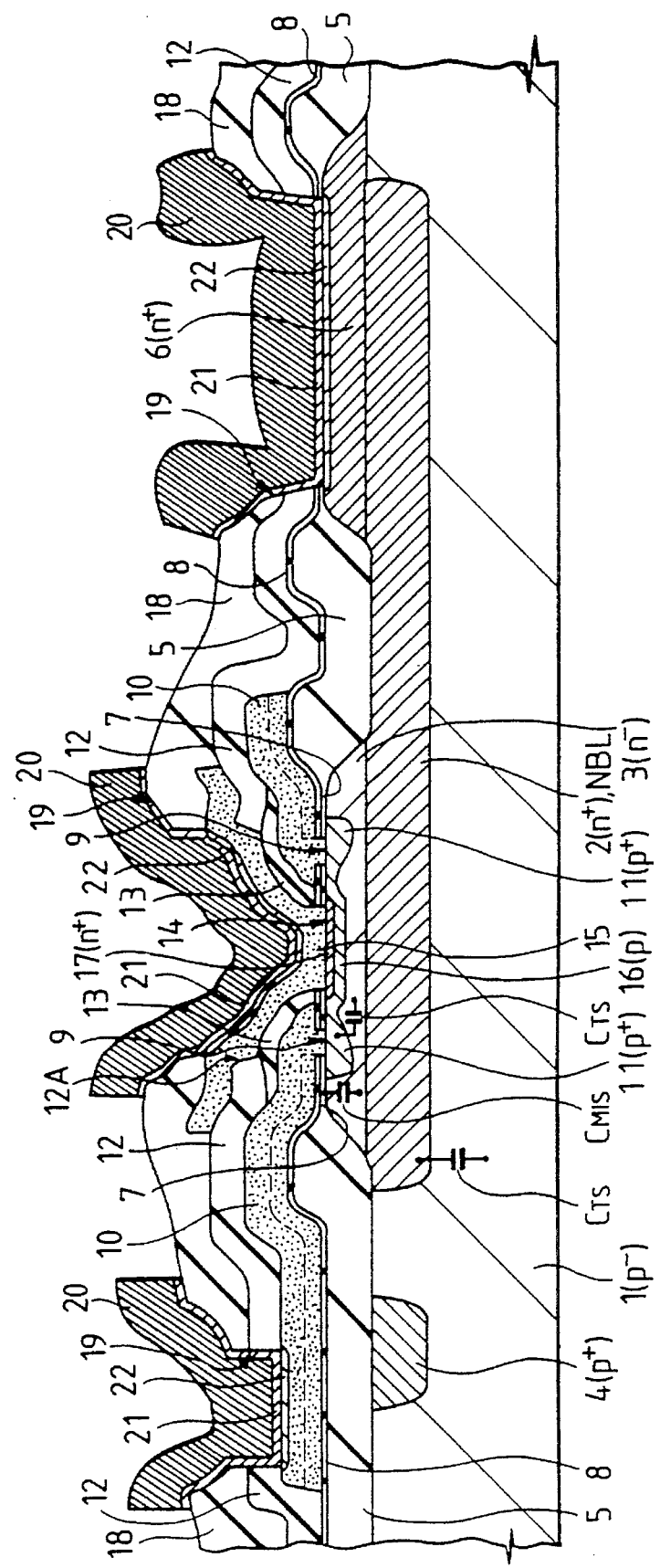
FIG. 2 is a sectional view taken along the line II—II of FIG. 1.

The bipolar transistor of SEPT structure pertaining to one embodiment of the present invention has a construction as shown in FIG. 1 (plan view) and FIG. 2 (sectional view taken along the line II—II in FIG. 1). Incidentally, for brevity, the bipolar transistor shown in FIG. 1 does not have the aluminum conductor layer and interlayer isolation films (12, 18) shown in FIG. 2.

As shown in FIGS. 1 and 2, the bipolar transistor of SEPT structure is formed on the major surface of a p⁻-type semiconductor substrate 1 which is made of single-crystal silicon. The bipolar transistor of SEPT structure is defined by the isolation region formed by the semiconductor substrate 1, the p⁺-type semiconductor region 4, and the element separating isolation film (field insulating film) 5, and is electrically isolated from other semiconductor regions. The P⁺-type semiconductor region 4 is formed on the major surface of the semiconductor substrate 1. The element separating isolation film 5 is, for example, a thick silicon oxide film which is formed on the major surface of the semiconductor substrate 1.

The bipolar transistor of SEPT structure has the n-type collector region, p-type base region, and n-type emitter region which constitute the npn construction. The bipolar transistor of SEPT structure has the n-type emitter region, p-type base region, and n-type collector region which are arranged consecutively and vertically in the direction of thickness from the surface of the n-type epitaxial layer formed on the semiconductor substrate 1.

The n-type collector region is composed of the buried n⁺-type semiconductor region (NBL) 2, the n⁺-type semiconductor region 6 to increase the collector potential, and the n⁻-type epitaxial layer 3. The buried n⁺-type semiconductor region 2 is formed between the semiconductor substrate 1 and the epitaxial layer 3 in the bipolar transistor forming region. The plane figure of the n⁺-type semiconductor region 2 is indicated by the two-dot chain line in FIG. 1. The buried n⁺-type semiconductor region 2 is constructed such that the collector resistance is reduced across the effective region for transistor operation and the n⁺-type semiconductor region to increase the collector potential. The effective region for transistor operation is the island region of the epitaxial layer 3 on which the p-type base region and the n-type emitter region are formed. (The left side in FIGS. 1 and 2.) The n⁺-type semiconductor region 6 to increase the collector potential is formed on the major surface of the epitaxial layer 3 such that its bottom is in contact with the n⁺-type semiconductor region 2.

The n⁺-type semiconductor region 6 to increase the collector potential is formed on the front of the semiconductor substrate 1 such that it increases the collector potential. The epitaxial layer 3 is formed (grown) on the major surface of the semiconductor substrate 1.

To the n⁺-type semiconductor region 6 is connected the collector conductor 20 through the connecting hole 19 formed in the interlayer isolation films 8, 12, and 18. The pattern of the connecting hole 19 is indicated by the mark  in FIG. 1. (Incidentally, on the n⁺-type semiconductor region 6 are formed PtSi layer 22 to reduce contact resistance and TiN layer 21 to prevent alloy spiking.) The interlayer isolation film 8 is formed from, for example, silicon nitride. The interlayer isolation film 12 is formed from, for example, silicon oxide. The interlayer isolation film 18 is, for example, a PSG film. The collector conductor 20 is, for example, an aluminum alloy film, which is incorporated with Cu to reduce migration and Si to reduce alloy spiking.

The p-type base region is composed of the p⁺-type semiconductor region 11 used as the graft base region (or the external base region) and the p-type semiconductor region 16 used as the intrinsic base region. The p⁺-type semiconductor region 11 and the p-type semiconductor region 16 are formed on the major surface of the epitaxial layer 3 in the effective region for transistor operation. The p⁺-type semiconductor region (graft base region) 11 is formed such that it surrounds the p-type semiconductor region (intrinsic base region) 16. The p⁺-type semiconductor region 11 is away from the end (bird's beak part) of the element separating isolation film 5 as much as or more than the amount of displacements of the mask from the desired location in the fabricating steps. The p⁺-type semiconductor region 11 is formed by introducing a p-type impurity by, for example, ion implantation. The p-type semiconductor region 16 is formed by, for example, introducing a p-type impurity into the emitter lead-out electrode 15 and then diffusing this p-type impurity by drive-in diffusion. (This method is not limitative.)

To the p⁺-type semiconductor 11 used as the graft base region of the p-type base region is connected one end of the base lead-out electrode 10 through the base opening 9 formed in the thin isolation film 7 (such as silicon oxide film, having an unlimited thickness) and the interlayer isolation film 8. The base opening 9 is indicated by the hatched area  in FIG. 1. The base lead-out electrode 10 is made of polycrystalline silicon film deposited by the CVD process. This polycrystalline silicon film is doped with a p-type impurity (such as boron) to reduce the resistance. The position of one end of the base lead-out electrode 10 (that side which defines the region of the emitter opening 14) is determined by the distance over which the p-type impurity diffuses from the p⁺-type semiconductor region 11, and consequently it is self-aligned to the p⁺-type semiconductor region 11. The other end of the base lead-out electrode 10 extends over the n-type collector region (the epitaxial layer 3), with the thin isolation film 7 interposed, and also over the element separating isolation film 5. As FIGS. 1 and 2 show, the base wiring (20) is connected to the base lead-out electrode 10 through the connecting hole 19, as in the case of the above-mentioned collector wiring 20. The base wiring (20) and the collector wiring (20) are formed in the same fabricating step.

The n-type emitter region consists of the n⁺-type semiconductor region 17, which is formed on the major surface of the p-type semiconductor region 16 used as the intrinsic base region. The n⁺-type semiconductor region 17 is formed by introducing an n-type impurity (As) to the emitter lead-out electrode 15 and diffusing this n-type impurity by drive-in diffusion. This method is not limitative.

To the n⁺-type semiconductor region 17, which is the n-type emitter region, is connected the emitter lead-out electrode 15 through the emitter opening 14. The emitter opening 14 is formed in the region defined by the interlayer isolation film 13 formed on the surface at one end side of the base lead-out electrode 10 and also by the connecting hole 12A formed in the interlayer isolation film 12. The interlayer isolation film 13 is a silicon oxide film formed by oxidizing the surface of the base lead-out electrode (polycrystalline silicon film) 10. The emitter opening 14 is formed by etching the isolation films 8 and 7 by using the interlayer isolation film 13 as a mask. Therefore, the emitter opening 14, the connecting position of the emitter lead-out electrode 15, and the n-type emitter region (n⁺-type semiconductor region 17) are formed by self-alignment to the base lead-out electrode 10 (or the base regions 11 and 16). The emitter lead-out electrode 15 is a polycrystalline silicon film deposited by, for example, the CVD process, and the polycrystalline silicon film is doped with an n-type impurity. To the emitter lead-out electrode 15 is connected the unshown emitter wiring (20) through the connecting hole 19. The emitter wiring (20) is formed in the same fabricating step as for the collector wiring 20 and the base wiring (20). Incidentally, the emitter opening 14 is indicated by the hatched area  in FIG. 1. For brevity, the connecting hole 19 for the emitter wiring 20 is not shown in FIG. 1.

On each of the emitter wiring (20), base wiring (20), and collector wiring 20 is formed an unshown final passivation film, with one or more wiring layers interposed thereunder.

The bipolar transistor of SEPT structure has the plane figure as shown in FIG. 1 and FIG. 3 (a plan view showing the effective region for transistor operation in the fabricating steps). The bipolar transistor of SEPT structure under development by the present inventors is produced by the 0.8–0.5 μm process (in which the minimum fabricating dimension or the resolution limit of photolithography is 0.8–0.5 μm).

The emitter opening 14 to define the n⁺-type semiconductor region 17 which is the n-type emitter region has a rectangular figure, for example, 0.8 μm in width ($W_E$) and 3.0 μm in length ($L_E$), as shown in FIG. 3. The emitter opening 14 has a rectangular figure as mentioned above so that it enhances the current driving capacity, thereby reducing the base resistance. The square corners of the rectangle of the emitter opening 14 become rounded along the curve having a curvature radius R1 of about 0.2 μ, after the fabricating step is completed (or the product is finished). According to the fundamental studies by the present inventors, the actual pattern produced by the patterning through a reticle mask has rounded corners resulting from the interference at the time of exposure and the interference at the time of film growing. The rounded corners have a curvature radius of about ⅙ to ¼ of the minimum fabricating dimension in the fabricating step. In other words, the corners of the emitter opening 14 are cut off spontaneously. In the case where the electron beam exposure system is employed, the corners which are spontaneously cut off are smaller than in the case mentioned above.

The base opening 9 to define the p⁺-type semiconductor region 11 which is the graft base region of the p-type base region has an opening width of about 0.2 μm and surrounds the emitter opening 14, with a gap of about 0.45 μm left between them. The base opening 9 has a rectangular figure which surrounds the periphery of the emitter opening 14, with the square corners of the rectangle rounded off.

The square corners of the base opening 9 are not spontaneously rounded off but are deliberately rounded off. To be concrete, the square corners of the base opening 9 are rounded off along two straight lines inclined about 45°, which are tangent to the curves each having a curvature radius R2 of about 0.45 μm and a curvature radius R3 of about 0.7 μm. Alternatively, the corners of the base opening 9 may be rounded off along the curves having the curvature radii of R2 and R3. In other words, the square corners of the base opening 9 are deliberately rounded off more than they are spontaneously rounded off, and they are rounded off along the curves having the curvature radii of R2 and R3 or along one or more straight lines tangent to the curves. With the corners rounded off, the rectangular base opening 9 has the long sides, short sides, and corners which are substantially uniformly separated from the emitter opening 9 as compared with the case in which the corners are not rounded off.

The p⁺-type semiconductor region 11 used as the graft base region which is defined by the base opening 9 has a rectangular figure, with the corners thereof rounded off as indicated by 11A (hatching) in FIG. 3. Therefore, the p⁺-type semiconductor region 11 used as the graft base region has a reduced peripheral length. This means that the area of the pn-junction with the epitaxial layer 3 which is the n-type collector region can be reduced as much as the area corresponding to the corners rounded off.

The element separating isolation film 5 which surrounds the p⁺-type semiconductor region 11 used as the graft base region of the p-type base region also has a rectangular figure, with the corners thereof cut off, like the above-mentioned base opening 9 and the p⁺-type semiconductor region 11. Each square corner of the element separating isolation film 5 is cut off along the line intersecting the long side and short side at the points about 0.8 μm away from the angular point. It is possible to deliberately cut off the square corners of the element separating isolation film 5 (the square corners of the bird's beak end), because the square corners of the p⁺-type semiconductor region 11 used as the graft base region are rounded off and there is a sufficient allowance for the mask placement for the p⁺-type semiconductor region 11 in the fabricating step.

Cutting off the square corners of the element separating isolation film 5 means that the epitaxial layer 3 which becomes the low-impurity concentration collector region has a plane figure, with the corners thereof cut off, as shown in FIGS. 1 and 3.

By cutting off the square corners of the element separating isolation film 5, it is possible to reduce the parasitic MIS capacity $C_{MIS}$ (base-collector capacity $C_{TC}$) characteristic of the bipolar transistor of SEPT-structure, which is formed by laying the n-type collector region (semiconductor), the insulation films 7 and 8 (insulator), and the base lead-out electrode 10 (metal) one on top of another, as shown in FIG. 2. In the case of the bipolar transistor of SEPT structure as shown in FIG. 3, the reduction $\Delta C_C$ of the capacity $C_C$ which is achieved by cutting off the corners is given by the equation (1) below.

$$\Delta C_C = 4(\Delta C_{MIS} \cdot \Delta S_{MIS} + \Delta C_{GB} \cdot \Delta L_{GB}) \ldots \quad (1)$$

where, $\Delta C_{MIS}$ : MIS capacity per unit area $$\Delta S_{MIS} = S_A - S_B \ldots \quad (2)$$

$\Delta S_{MIS}$ : MIS area cut off $\Delta C_{GB}$ : capacity per unit length of graft base region $$\Delta L_{GB} = 2C - D \ldots \quad (3)$$

$\Delta L_{GB}$ : graft base length cut off

The area $S_A$ in the equation (2) above represents the area of the square corners (not cut off) of the element separating isolation film 5 as shown in FIG. 4. (This area corresponds to that of the overlapping part of the n-type collector region and the base lead-out electrode 10.) Therefore, the area $S_A$ may be expressed by the equation (4) below.

$$S_A = (a+C)^2 - C^2 = a^2 + 2aC \ldots \quad (4)$$

The area $S_B$ in the equation (2) above represents the area of the square corners (cut off) of the element separating isolation film 5 as shown in FIG. 3. (This area corresponds to that of the overlapping part of the n-type collector region and the base lead-out electrode 10.) Therefore, the area $S_B$ may be approximately expressed by the equation (5) below.

$$S_B \approx a \times D = \sqrt{2}\, aC \ldots \quad (5)$$

Therefore, $\Delta S_{MIS}$ in the equation (2) above may be expressed by the equation (6) below.

$$\Delta S_{MIS} = S_A - S_B = (a^2 + 2aC) - (\sqrt{2}\, aC) = a^2 + (2-\sqrt{2})aC \ldots \quad (6)$$

Thus, every square corner corresponding to the area of $a^2+(2-2)aC$ contributes to the reduction of the MIS area formed by the collector region 3 and the base lead-out electrode 10, and this leads to the reduction of the parasitic MIS capacity.

Furthermore, the buried $n^+$-type semiconductor region 2 of the n-type collector region has a rectangular figure which extends from the effective region for transistor operation to the $n^+$-type semiconductor region 6 to increase the collector potential, with two square corners $S_C$ cut off in the effective region for transistor operation. The square corners $S_c$ of the buried $n^+$-type semiconductor region 2 are cut off deliberately as mentioned above.

As mentioned above, the present invention provides a semiconductor integrated circuit device having bipolar transistors of vertical structure, with a square buried $n^+$-type semiconductor region 2 (collector region) formed on the semiconductor substrate, said semiconductor integrated circuit device being characterized by that the square corners of the buried $n^+$-type semiconductor region 2 are cut off, so that the peripheral length of the buried $n^+$-type semiconductor region 2 is reduced and the area of the pn-junction between the buried $n^+$-type semiconductor region 2 and the semiconductor substrate 1 is reduced. This leads to the reduction of the collector-substrate parasitic capacity $C_{TS}$ and the increase of the operating speed of the bipolar transistor of vertical structure.

Moreover, the present invention provides a semiconductor integrated circuit device having bipolar transistors of vertical structure in which the $p^+$-type semiconductor region 11 which is the graft base region is formed in the region which is the major surface of the semiconductor substrate 1, with an epitaxial layer 3 interposed on said buried $n^+$-type semiconductor region 2, and is surrounded by the rectangular element separating isolation film 5, and the base lead-out electrode 10 connected to the $p^+$-type semiconductor region 11 extends over the element separating isolation film 5, said semiconductor integrated circuit device being characterized by that the square corners of the element separating isolation film 5 surrounding the $p^+$-type semiconductor region 11 which is the graft base region are cut off. The cutting of the square corners produces not only the above-mentioned effects but also the effect of reducing the overlapping area of the epitaxial layer 3 and the base lead-out electrode 10 which corresponds to the allowance of the mask placement (in the fabricating step) between the element separating isolation film 5 and the $p^+$-type semiconductor region 11. This leads to the reduction of the MIS capacity $C_{MIS}$ and the increase of the operating speed of the bipolar transistor of vertical structure.

Moreover, the present invention provides a semiconductor integrated circuit device having bipolar transistors of vertical structure in which the $p^+$-type semiconductor region 11 which is the graft base region has a rectangular plane figure, said semiconductor integrated circuit device being characterized by that the square corners of the $p^+$-type semiconductor region 11 which is the graft base region are cut off. The cutting of the square corners produces not only the above-mentioned effects but also the effect of reducing the peripheral length of the $p^+$-type semiconductor region 11 and the area of the pn-junction between the $p^+$-type semiconductor region 11 and the epitaxial layer 3 which is the n-type collector region. This leads to the reduction of the base-collector parasitic capacity $C_{TC}$ and the increase of the operating speed of the bipolar transistor of vertical structure.

The above-mentioned bipolar transistor of SEPT structure developed by the present inventors is characterized by that the base-collector parasitic capacity $C_{TC}$ including the parasitic MIS capacity $C_{MIS}$ is 14–15 fF compared to 22–23 fF in the case of conventional structure. In addition, the bipolar transistor of SEPT structure pertaining to the present invention is characterized by that the gate delay time is reduced by about 15% compared with that of the bipolar transistor as shown in FIG. 4.

The square corners of the $p^+$-type semiconductor region 11 which is the graft base region (as shown in FIG. 4) usually permit the impurity to diffuse more to the base lead-out electrode 10 than other parts owing to the proximity effect. Therefore, one end of the base lead-out electrode 10 at the square corners of the $p^+$-type semiconductor region 11 becomes longer toward the emitter opening 14 than that of the base lead-out electrode 10 at the linear portions of the $p^+$-type semiconductor region 11. Since the emitter opening 14 and the $n^+$-type semiconductor region 17 which is the emitter region are formed by self-alignment to the base lead-out electrode 10, the distance between the square corners of the $p^+$-type semiconductor region 11 and the square corners of the $n^+$-type semiconductor region 17 becomes longer than other parts (the distance between portions of straight line). This leads to the increase of the resistance of the p-type base region, which in turn deteriorates the frequency characteristics. However, this is not the case with the bipolar transistor of this invention as shown in FIG. 3, because the square corners of the $p^+$-type semiconductor region 11 are cut off as mentioned above and hence the emitter-base separating distance is made uniform. This leads to the substantial reduction of the resistance of the p-type base region and hence leads to the improvement of the frequency characteristics of the bipolar transistor.

In addition, the bipolar transistor of SEPT structure in the present invention is characterized by that the square corners of the base lead-out electrode 10 and the emitter lead-out electrode 15 are cut off. This leads to the reduction of the emitter-base parasitic MIM capacity $C_{MIM}$ (emitter lead-out metal 15 - insulation 12, 13 - base lead-out metal 10).

The process for producing the bipolar transistor of SEPT structure (as shown in FIGS. 1 to 3) pertaining to the present invention will be briefly explained in sequence of the fabricating steps with reference to FIGS. 5 to 20 (which are sectional views showing important parts in each fabricating step). Incidentally, the dimensions in FIG. 2 are different from those in FIGS. 5 to 20; however, it should be understood that the parts with the same reference number have the same function and are produced in the same fabricating step.

At first, the $p^+$-type semiconductor substrate 1 of single-crystal silicon is prepared.

An n-type impurity is selectively introduced into the major surface of the semiconductor substrate 1 within the region in which the bipolar transistor is formed.

Figure 5:
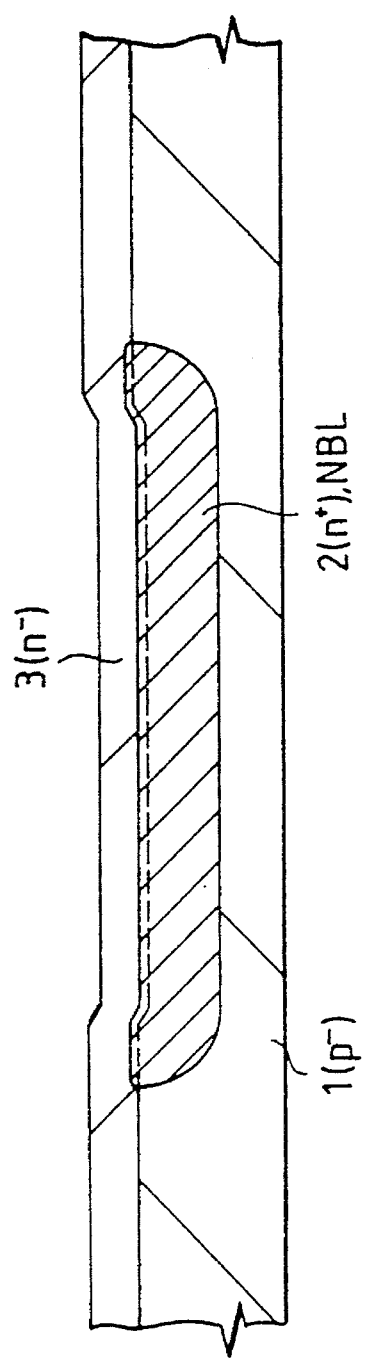

An $n^-$-type epitaxial layer 3 is grown on the major surface of the semiconductor substrate 1 as shown in FIG. 5. At the same time, a buried $n^+$-type semiconductor region 2 is formed by applying prolonged diffusion to the previously introduced n-type impurity.

An isolation film 7 and a mask 7a are formed on the major surface of the epitaxial layer 3 within the region in which the emitter region, base region, and collector region are formed. The isolation film 7 is a silicon oxide film formed by the thermal oxidation of the surface of the epitaxial layer 3. The mask 7a is a silicon nitride film deposited by, for example, the CVD process, so that it can be used as an etching mask and a thermal oxidation mask.

Figure 6:
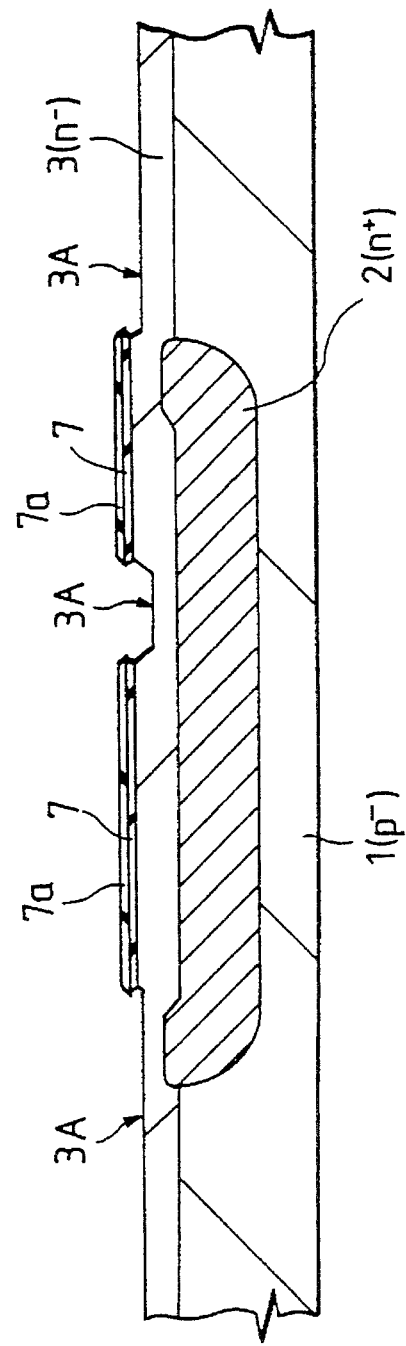

The unnecessary region on the major surface of the epitaxial layer 3 is removed by etching using the mask 7a so as to form a groove 3A, as shown in FIG. 6. This groove 3A is formed in the region in which the element separating isolation film (5) of the separation region is formed.

A p-type impurity is introduced into the major surface of the epitaxial layer 3 (and/or the semiconductor substrate 1) in the element separating region.

Figure 7:
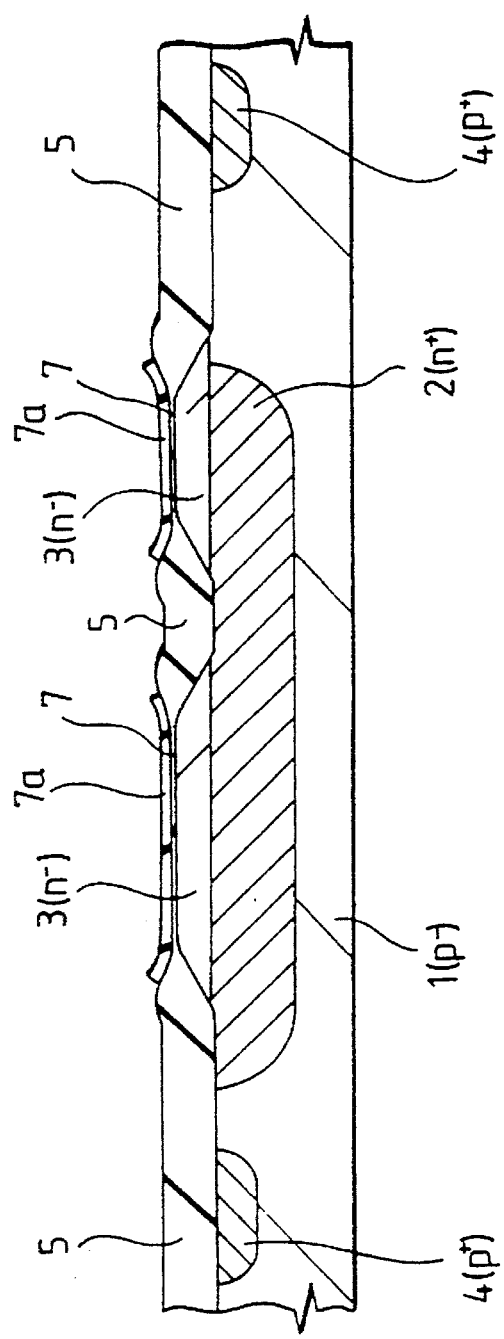

An element separating isolation film 5 is formed on the major surface of the epitaxial layer 3 in the groove 3A by thermal oxidation using the mask 7a, as shown in FIG. 7. At the same time, a $p^+$-type semiconductor region 4 is formed by applying prolonged diffusion to the previously introduced p-type impurity, as shown in FIG. 7.

Figure 8:
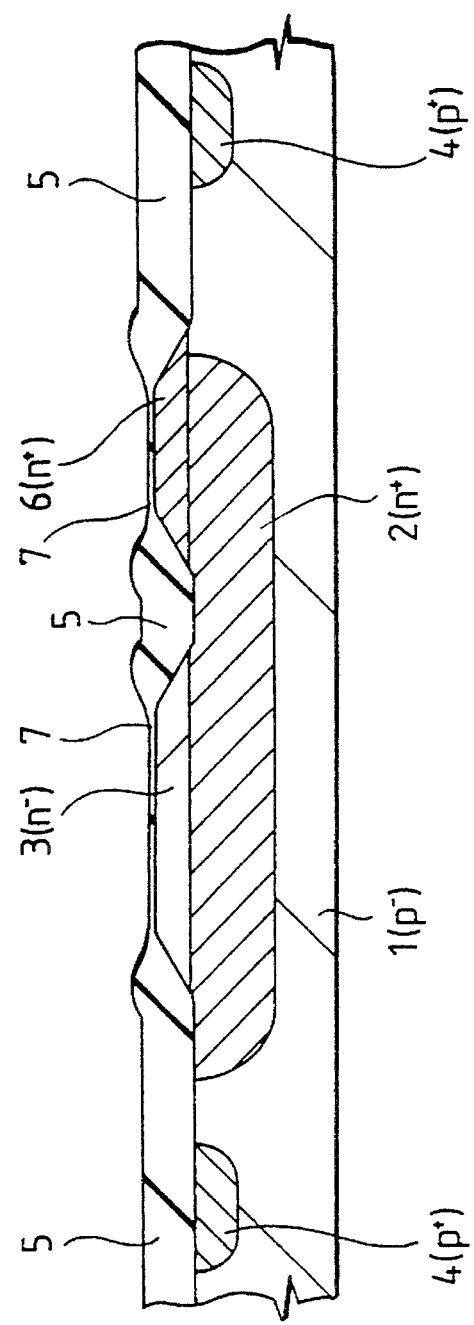

The mask 7a is removed, and an $n^+$-type semiconductor region 6 to increase the collector potential is formed on the major surface of the epitaxial layer 3 within the region in which the collector region is formed, as shown in FIG. 8. The $n^+$-type semiconductor region 6 may be formed by introducing an n-type impurity by the ion implantation process.

A mask 8, a polycrystalline silicon film 10a, a mask 24, and a mask 25 are laminated consecutively all over the substrate including the element separating isolation film 5 and the isolation film 7. The mask 8 is a silicon nitride film deposited by, for example, the CVD process, so that it has the etching selectivity for the polycrystalline silicon film and silicon oxide film and can be used as a mask for the introduction of an impurity. The polycrystalline silicon film 10a is deposited by the CVD process and has a thickness of about 1500–2500 Å. This polycrystalline silicon film 10a is not doped with an impurity to reduce the resistance. The mask 24 is formed from, for example, a silicon oxide film, and the mask 25 is formed from, for example, a silicon nitride film.

A mask 26 is formed on the mask 25 in the region in which the emitter region is formed. The mask 26 is formed from, for example, a photoresist so that it can be used as a mask for etching and also for the introduction of an impurity.

Using the mask 26, the mask 25 is removed, except the masked region. A p-type impurity is introduced by ion implantation into the most part of the polycrystalline silicon film 10a through the mask 24 by using the mask 26, thereby to form a p-type polycrystalline silicon film 10b, as shown in FIG. 9.

The mask 26 is removed. Using the mask 25 patterned by the mask 26, the mask 24 is removed, except the masked region, by etching. At the same time, the mask 24 under the edge of the mask 25 is subjected to side etching, so that part of the remaining undoped polycrystalline silicon film 10a is exposed. After that, the mask 25 is removed.

Using the mask 24 and the polycrystalline silicon film 10b, part of the undoped polycrystalline silicon film 10a, which has been exposed as the result of the side etching of the mask 24, is removed by etching, thereby to form an opening 9a, as shown in FIG. 10. This etching is performed by utilizing the concentration-dependent diffusivity of the polycrystalline silicon film. The opening 9a has a minute dimension which is determined by the amount of side etching of the mask 24 and the amount of etching of the polycrystalline silicon film 10a.

The mask 24 is removed. Using the polycrystalline films 10a and 10b, part of the mask 28 is removed by etching. After that, the polycrystalline silicon film 10a is selectively removed.

Using the polycrystalline film 10b and the mask 8, a $p^+$-type semiconductor region 11 as the graft base region is formed by ion implantation on the major surface of the epitaxial layer 3. (This ion implantation may be omitted, if necessary.)

Figure 11:
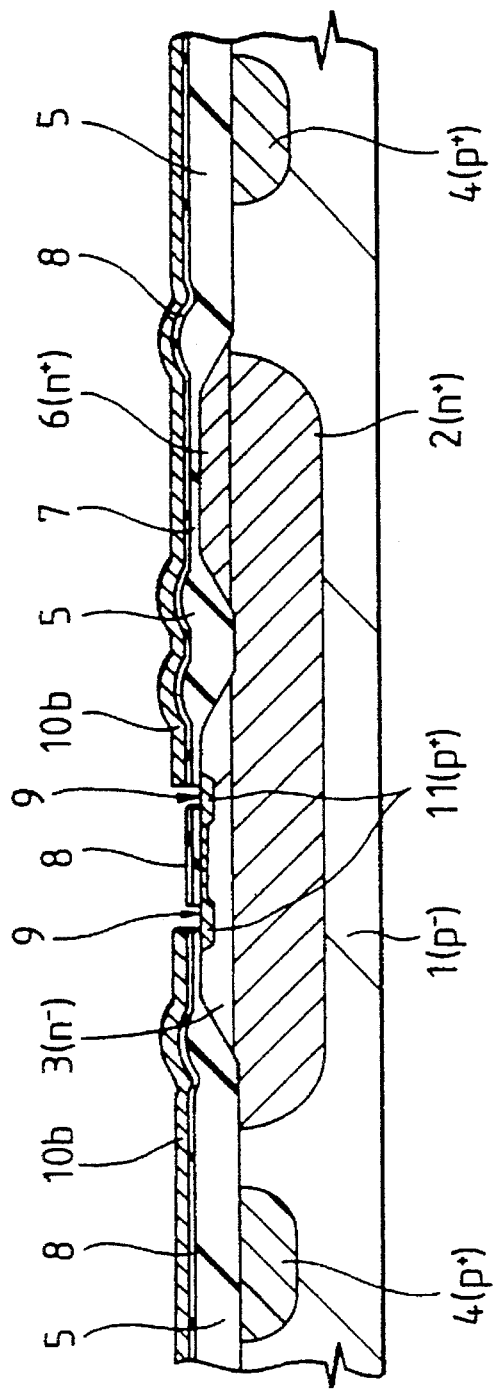

Using the polycrystalline film 10b and the mask 8, the isolation film 7 is removed, thereby to form the base opening 9, as shown in FIG. 11.

A polycrystalline silicon film 10c (about 2000–6000 Å thick) is deposited by the CVD process all over the substrate including the polycrystalline silicon film 10b and the semiconductor region 11 exposed through the base opening 9. This polycrystalline silicon film 10c is not doped with an impurity to reduce the resistance.

Figure 12:
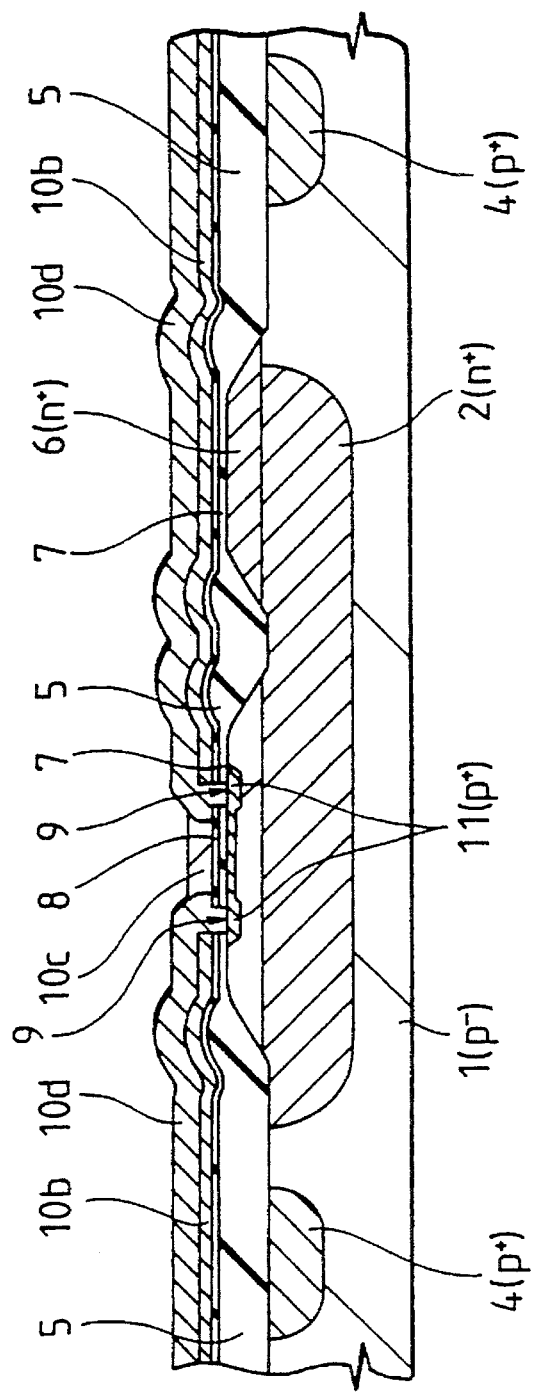

The entire surface of the substrate is subjected to heat treatment (at 900°–1000° C. for 30–50 min) so as to diffuse a p-type impurity in the semiconductor region 11 and a p-type impurity in the polycrystalline silicon film 10b into the polycrystalline silicon film 10c, thereby forming a p-type polycrystalline silicon film 10d, as shown in FIG. 12. Part of the polycrystalline silicon film 10c remains on the mask 8 (on the region on which the emitter is formed). The amount of the polycrystalline film 10c which remains depends on the amount of the p-type impurity which diffuses. In other words, it depends on the self-alignment to the semiconductor region 9.

Figure 13:
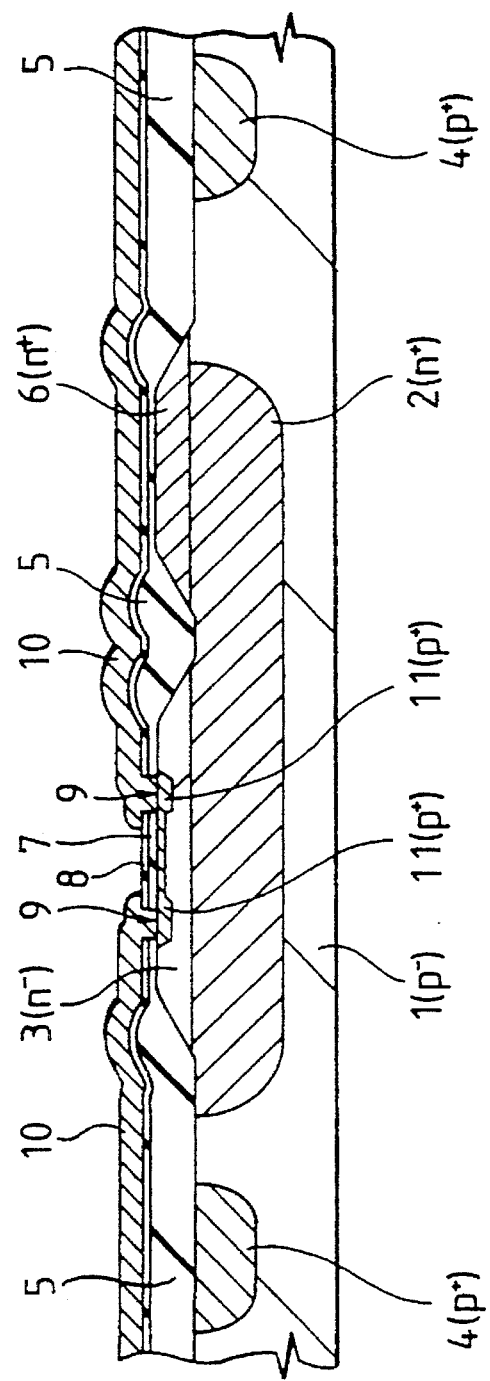
Figure 14:
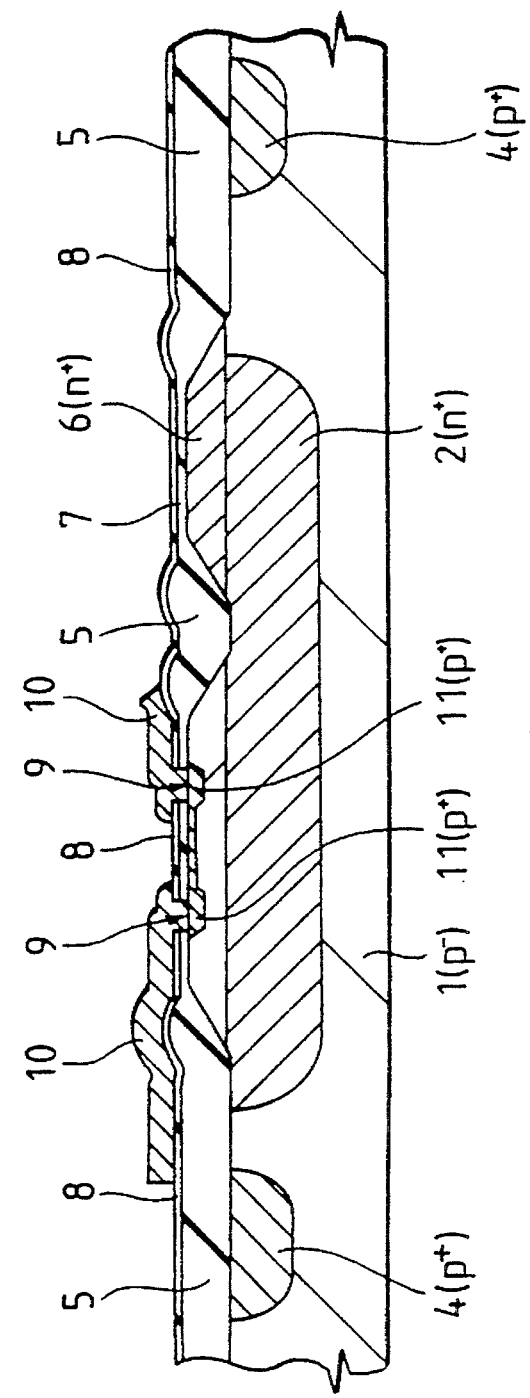

The polycrystalline silicon film 10c which has remained is selectively removed to form the base lead-out electrode 10 with the polycrystalline silicon films 10b and 10d both doped with a p-type impurity, as shown in FIG. 13. The semiconductor substrate in the region in which the polycrystalline silicon-film has been removed is doped with boron by ion implantation to form a connecting base region which stably connects the graft base and intrinsic base later. After that, the base lead-out electrode 10 is patterned as shown in FIG. 14.

An interlayer isolation film 12 and a mask 28 are laminated consecutively all over the substrate including the base lead-out electrode 10. The interlayer isolation film 12 is a silicon oxide film deposited by, for example, the CVD process. The mask 28 is, for example, a silicon nitride film, so that it is used as an etching mask and a thermal oxidation mask.

Part of the mask 28 is removed in the region in which the emitter region is formed. After that, the interlayer isolation film 12 is partly removed by using the mask 28 and an opening 12A is formed by isotropic etching such that part of one end of the base lead-out electrode 10 is exposed. (This exposed part may be formed by anisotropic dry etching.)

Figure 15:
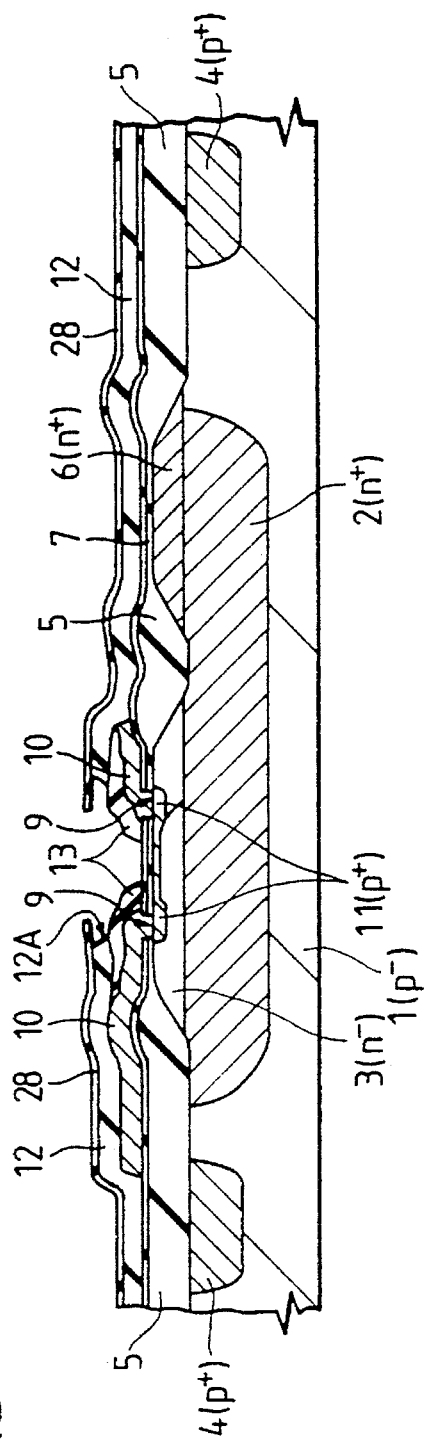

Using the masks 28 and 8, the entire surface of the substrate is exposed to thermal oxidation so as to form an interlayer isolation film 13 on the surface of one end of the base lead-out electrode 10, as shown in FIG. 15. The interlayer isolation film 13 is a silicon oxide film (about 2000–4000 Å thick) formed by oxidizing the surface of the base lead-out electrode 10.

Figure 16:
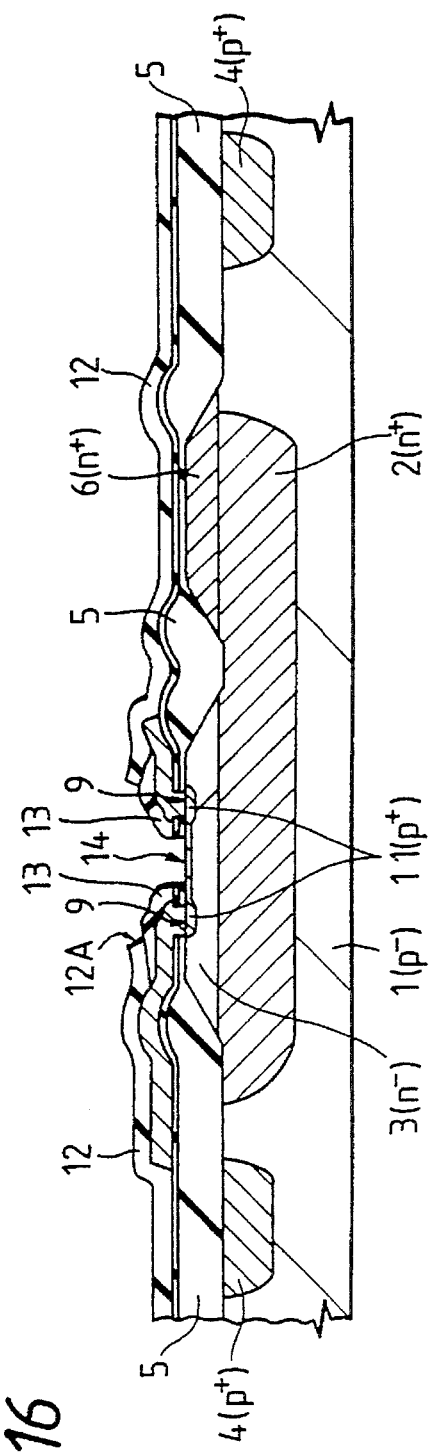

The masks 28 and 8 are removed. The isolation film 7 and part of the mask 28 are removed to form the emitter opening 14 in the region defined by the interlayer isolation film 13 formed on the surface of the base lead-out electrode 10, as shown in FIG. 16.

Figure 17:
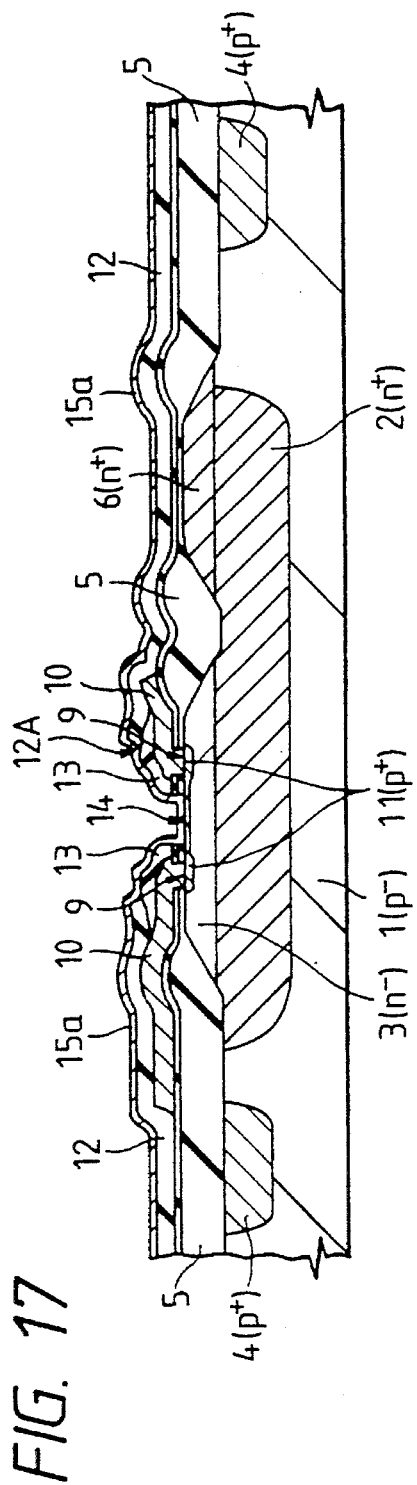

A silicon film 15a is formed all over the substrate including the major surface of the semiconductor region 11 (part of the graft base region) in the emitter opening 14, as shown in FIG. 17. The silicon film 15a is a polycrystalline silicon film (about 1000 Å thick) deposited by the CVD process. It is not doped with any impurity to decrease the resistance.

A thin silicon oxide film (not shown) is formed on the surface of the silicon film 15a. This silicon oxide film is about 30–50 Å thick and is formed by the thermal oxidation of the surface of the silicon film 15a. This silicon oxide film is intended to prevent the contamination with heavy metals and the damage which will otherwise occur during the introduction of an impurity.

A p-type impurity 14p is introduced into the entire surface of the silicon film 15a. (Before this step, implantation of a phosphorus impurity ($2-7 \times 10^{12}$ atoms/cm$^3$) with high energy (200–450 key) and annealing (800°–950° C. for about 10 minutes) may optionally be performed to selectively increase the concentration in the collector of the semiconductor substrate beneath the emitter, thereby to form a layer to prevent the base expanding effect, although this is not shown in the figure.) The p-type impurity 14p is boron in an amount of $10^{14}$ atoms/cm$^3$, and it is introduced by ion implantation with an energy of about 20 keV.

Figure 18:
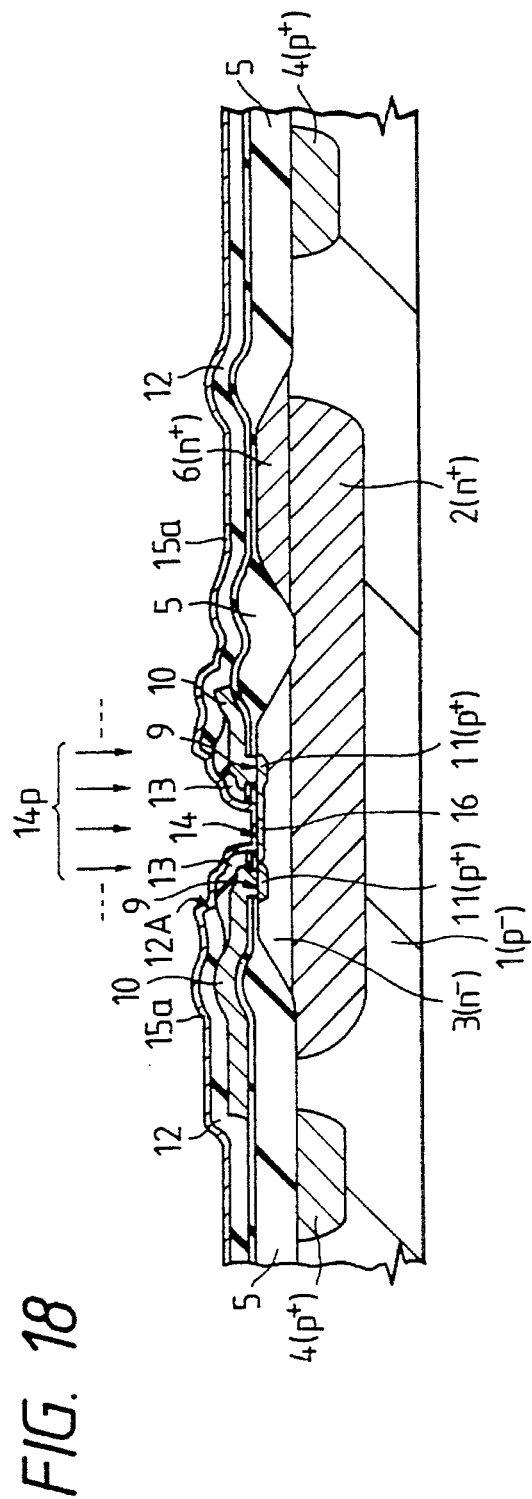

Heat treatment (annealing) is performed at 900°–1000° C. for 10–20 minutes so as to diffuse the p-type impurity 14p introduced into the silicon film 13A into the major surface of the epitaxial layer 3, thereby to form a p-type semiconductor region 16 which is used as the intrinsic base region, as shown in FIG. 18. In other words, the p-type semiconductor region 16 is formed by drive-in diffusion.

A thin silicon oxide film (not shown), about 150–250 Å thick, is formed on the surface of the silicon film 15a by the thermal oxidation of the surface of the silicon film 15a. This silicon oxide film is intended to prevent the heavy metal contamination and damage which will otherwise occur during the introduction of an impurity.

An n-type impurity 15n (As in an amount of $10^{16}$ atoms/cm$^3$) is introduced into the entire surface of the silicon film 15a by ion implantation with a low energy of 70–90 keV. When the n-type impurity 15n is introduced under such conditions, a zone of maximum concentration appears at the position about 500 Å from the surface of the silicon film 15a.

Figure 19:
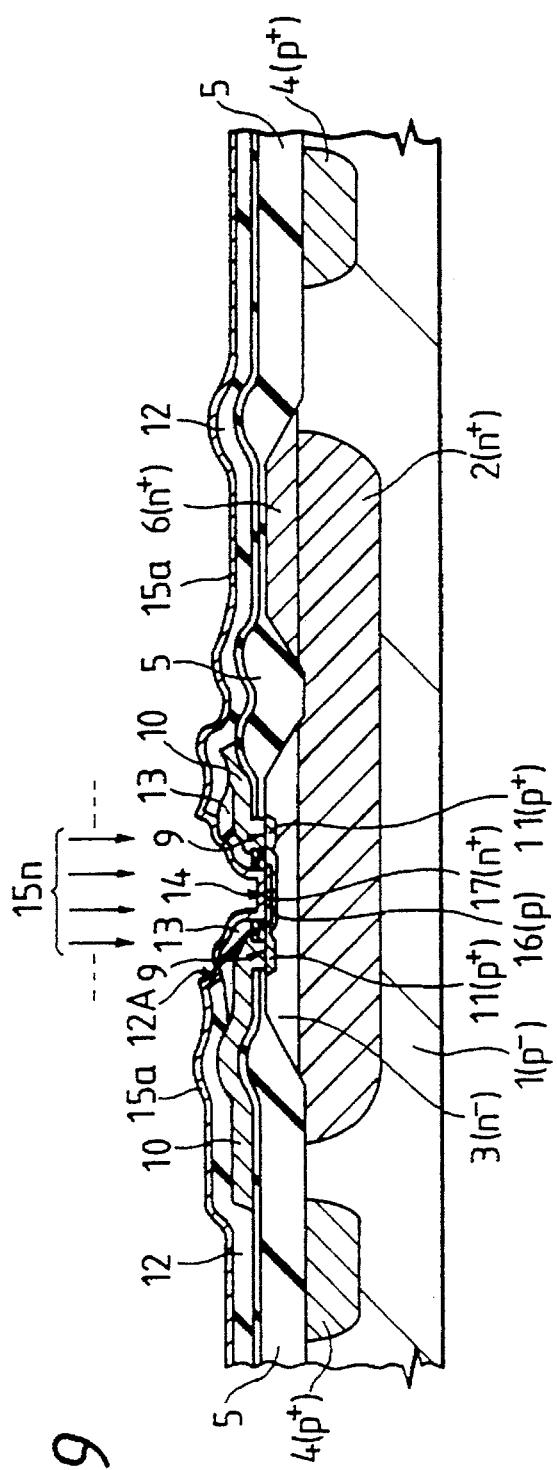

Heat treatment is performed at 900°–1000° C. for 40–60 minutes so as to diffuse the n-type impurity 15n introduced into the silicon film 15a into the major surface of the semiconductor region 16, thereby to form an n$^+$-type semiconductor region 17 which is used as the emitter region, as shown in FIG. 19. In other words, the n-type semiconductor region 17 is formed by drive-in diffusion.

A silicon film 15b, about 1500 Å thick, is deposited all over the silicon film 15a by the CVD process. The resistance of the silicon film 15b may be reduced by the diffusion of the n-type impurity 15n introduced into the silicon film 15a, said diffusion being performed by utilizing the subsequent step such as the heat treatment to densify the interlayer isolation film 18. The silicon film 15b is deposited on the silicon film 15a after the silicon film 15a has undergone heat treatment for the recovery of damage caused by the introduction of the n-type impurity 15n.

Alternatively, the silicon film 15b may be deposited on the silicon film 15a before the semiconductor region 17 is formed by the diffusion of the n-type impurity 15n introduced into the silicon film 15a. In this case, the resistance of the silicon film 15b may be reduced by the diffusion of the n-type impurity 15n introduced into the silicon film 15a, said diffusion taking place as the semiconductor region 17 is formed.

Figure 20:
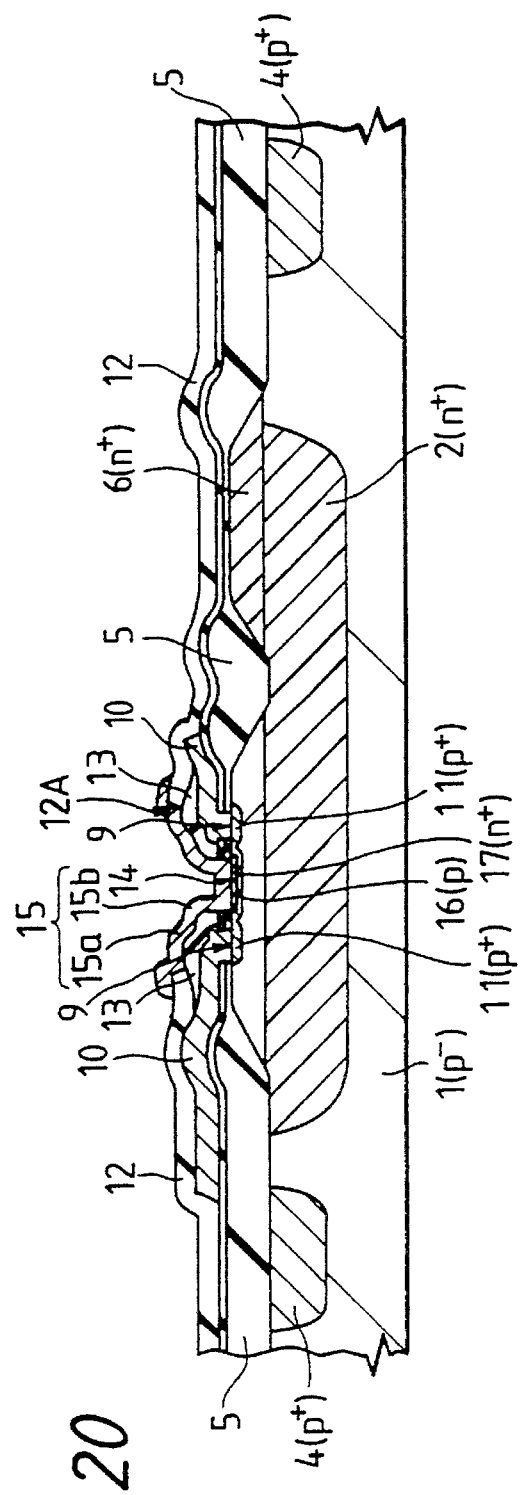

An emitter lead-out electrode 15 is formed by patterning the silicon films 15a and 15b, as shown in FIG. 20. Then, an interlayer isolation film 18 is formed all over the substrate including the emitter lead-out electrode 15. The interlayer isolation film 18 is a silicon oxide film deposited by the CVD process or a PSG film, and this silicon oxide film subsequently undergoes the densification treatment. The interlayer isolation film 18 may also be a four-layer laminate film composed of CVD oxide film, silicon nitride film, PSG film, and SOG film (mentioned in the order of the lower layer to the upper layer) so that it has improved flatness and environment resistance.

The interlayer isolation film 18 on each operating region or lead-out electrode is removed to form the respective connecting holes 19.

As shown in FIG. 2, a PtSi film 22 is formed on each semiconductor region exposed by the connecting hole 19, and a titanium nitride film 21 (as a barrier metal) and a wiring layer 20 of Al-Cu-Si alloy are formed in laminate. The emitter, base, and collector wiring layers 20 are formed by the prescribed patterning.

Finally, a passivation film (not shown) is deposited all over the substrate including the wiring layers 20 to complete the bipolar transistor of SEPT structure according to the present invention.

A modified embodiment of the semiconductor integrated circuit device having bipolar transistors of SEPT structure will be explained with reference to FIG. 21 (a plan view showing important parts) and FIG. 22 (a sectional view taken along the line III—III of FIG. 21. (For brevity, FIG. 21 does not show the wiring layer 20 and the interlayer isolation films 8, 12, and 18.) It should be understood that the parts shown in FIGS. 21 and 22 which have the same reference numbers as in FIGS. 1 to 20 have the same function or are produced in the same fabricating step.

Figure 21:
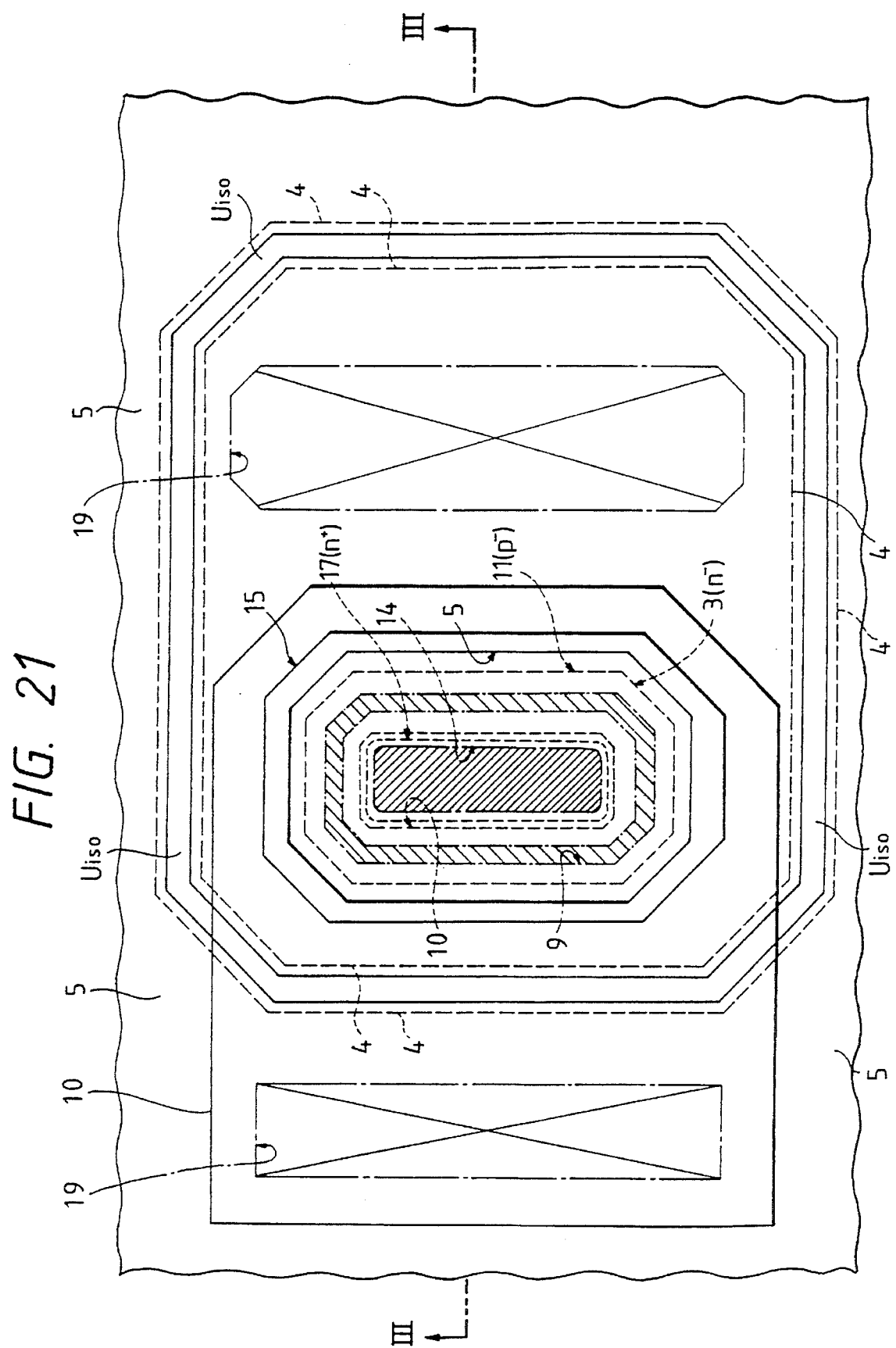
FIG. 21 is a plan view showing a bipolar transistor of SEPT structure which is a modification of the embodiment of the present invention.
Figure 22:
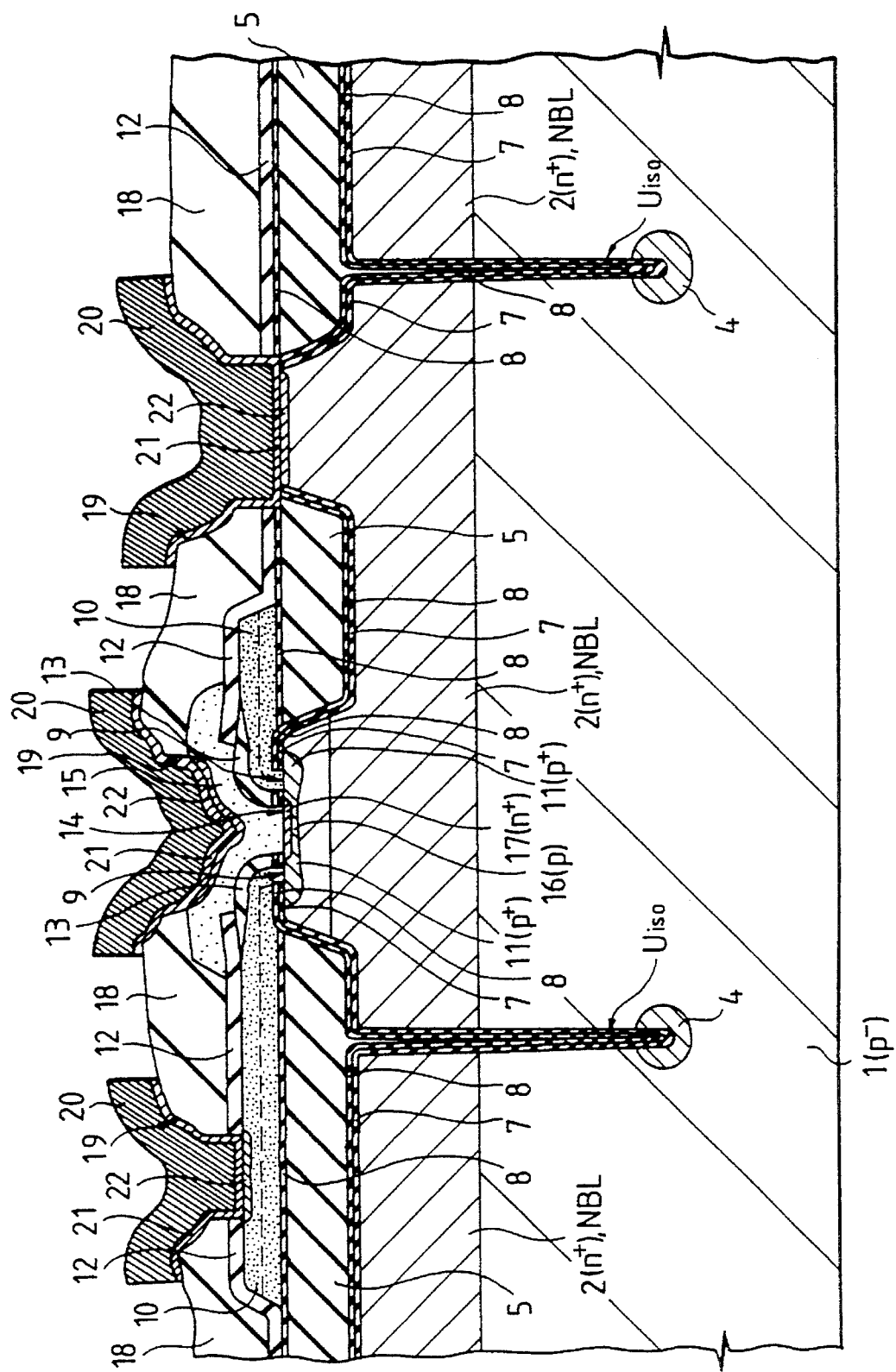
FIG. 22 is a sectional view taken along the line III—III of FIG. 21.

The modified embodiment shown in FIGS. 21 and 22 is characterized by that a region in which the bipolar transistor is formed is surrounded and electrically isolated by a groove $U_{iso}$ formed in the semiconductor substrate 1. In the groove $U_{iso}$ is formed a silicon oxide film 7 and a silicon nitride film 8 one over the other, and is also formed a CVD-SiO$_2$ film so as to fill the groove $U_{iso}$. The CVD-SiO$_2$ film is formed integrally with the element separating isolation film 5. The element separating isolation film 5 is formed by the same step as that for filling the CVD-SiO$_2$ film into the groove $U_{iso}$ which has been formed by etching consecutively the epitaxial layer 3 under the bottom of the grooved part 3A and the substrate 1 after the step shown in FIG. 6. At the bottom of the groove $U_{iso}$ in the semiconductor substrate 1 is formed a p$^+$-type semiconductor region 4, which functions as the channel stopper. The thus formed groove U$_{iso}$ for element separation has an approximately octagonal plane figure, with square corners thereof cut off, as shown in FIG. 21. This plane figure of the groove U$_{iso}$ defines the configuration of the buried semiconductor region 2 which reduces the series resistance of the collector. Since the buried semiconductor region 2 also has its square corners cut off, the capacity of the pn-junction between the p$^+$-type semiconductor substrate 1 and the buried semiconductor region 2 can be reduced. This permits the bipolar transistor to operate at a higher speed. The groove U$_{iso}$ for element separation is so narrow (0.25–0.5 μm) that it enables the reduction of a region necessary for element separation. This contributes to the higher degree of integration of the semiconductor integrated circuits having bipolar transistors.

Figure 23:
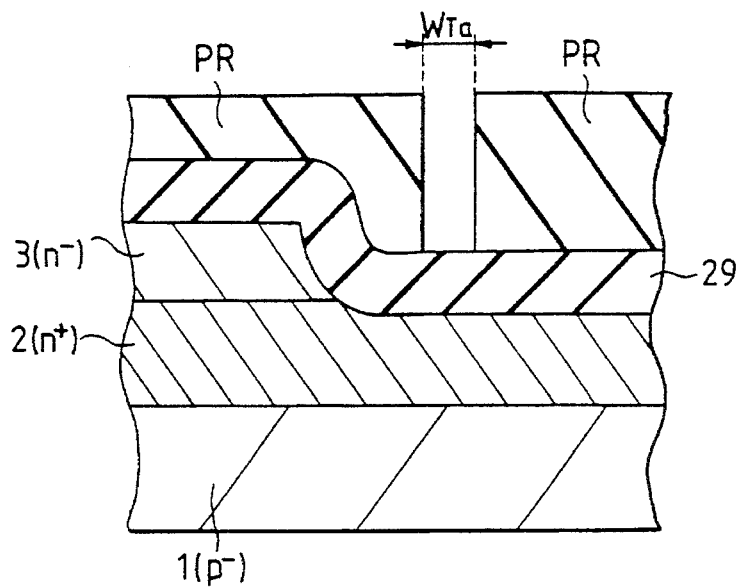
FIGS. 23 to 25 are sectional views showing important parts in the steps of fabricating the element separating region of the bipolar transistors shown in FIGS. 21 and 22.
Figure 24:
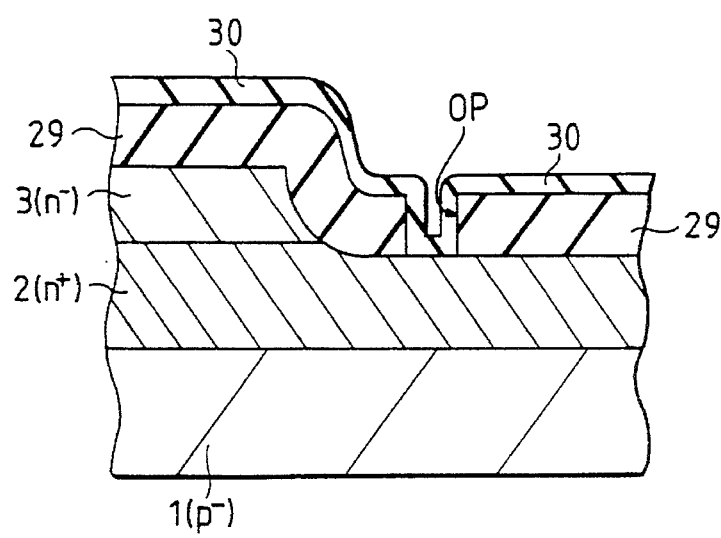
Figure 25:
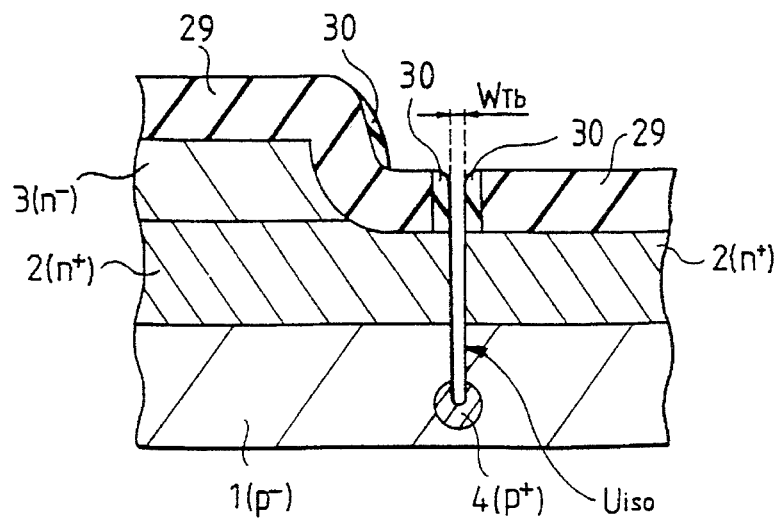

The fine groove U$_{iso}$ as narrow as 0.25–0.5 μm may be formed by the method briefly explained in the following with reference to FIGS. 23 to 25. After the grooved part 3A has been formed as shown in FIG. 6, a CVD-SiO$_2$ film 29 (about 0.7 μm thick) is formed all over the substrate 1. On the CVD-SiO$_2$ film 29 is coated a photoresist film PR, which is subsequently patterned by the ordinary photolithography technique. The patterning width W$_{Ta}$ of the photoresist PR is about 0.8 μm. Using the photoresist PR as a mask, the CVD-SiO$_2$ film 29 is selectively removed by etching, thereby to form the opening OP as shown in FIG. 24. (Subsequently, the photoresist film PR is completely removed.) Then, a CVD-SiO$_2$ film 30 (about 0.3 μm thick) is formed all over the substrate, and the CVD-SiO$_2$ film 30 is subjected to anisotropic etching to form a side wall 30 on the wall of the opening OP, as shown in FIG. 25. The width W$_{Tb}$ defined by the side wall 30 is about 0.2–0.3 μm. Using the side wall 30 and the CVD-SiO$_2$ film 29 as the etching mask, anisotropic etching (such as RIE) is performed on the buried semiconductor region 2 and the p-type semiconductor substrate 1 consecutively. Thus there is formed the groove U$_{iso}$ having the groove width W$_{Tb}$. Also, using the same mask as used for the groove U$_{iso}$, a p-type impurity (such as boron) is introduced into the p$^-$-type semiconductor substrate 1 to form the p$^+$-type semiconductor region (channel stopper) 4. The thus formed groove U$_{iso}$ has the finer groove width W$_{Tb}$ than can be achieved by the photolithography technique (which determines the minimum fabrication dimensions). This contributes to the higher degree of integration of the semiconductor integrated circuit device having bipolar transistors. In addition, since the CVD isolation film 5 on the groove has a high degree of flatness based on the narrow groove width and the octagonal plane figure, it contributes to the improvement of the microfabrication of LSI. The above-mentioned structure may be applied to the Si laminated wafer or SOI substrate (composed of thick Si supporting substrate (about 550 μm thick), oxide film (about 0.5–2 μm thick), and thin Si film single-crystal substrate (about 0.5–3 μm thick)), to enhance the α-particle protection. In this case, the p$^+$-type semiconductor region 4 (as the channel stopper) may be omitted.

Although the invention has been described in its preferred form with a certain degree of particularity, it is to be understood that the invention is not limited to the specific embodiments but various modifications may be made without departing from the spirit and scope of the invention.

For example, the octagonal plane figure of the p$^+$-type semiconductor region 11 (which is the graft base region of the bipolar transistor of SEPT structure) and the element separating isolation film 5 surrounding it, which is formed by cutting off the square corners as shown in the foregoing embodiment, may be replaced by a pentagonal plane figure formed by cutting off only one square corner, or by a substantially circular or oval plane figure. The octagonal plane figure may also be applied to the n$^+$-type semiconductor region which increases the collector potential. In addition, it produces the effect of not only reducing the parasitic capacity but also relieving the stress concentration of elements and improving the three-dimensional uniformity of oxidation and impurity diffusion.

The present invention may be applied to not only bipolar transistors of SEPT structure but also bipolar transistors of SICOS (Sidewall Contact Structure) structure and planar transistors.

A further description will now be provided for a bipolar transistor having an element isolation structure improved by U-shaped groove isolation in accordance with another aspect of the invention.

In the past there has been disclosed, as one of element isolation structures of semiconductor integrated circuit devices, a groove isolation structure, for example, in "Nikkei Electronics" (pp. 94 to 95) published on Mar. 29, 1982, in which a groove is made on the main surface of a semiconductor substrate by etching to surround the active region where active elements such as bipolar transistor, MOSFET, and others are formed, and polysilicon is filled in said groove.

As a method of manufacturing a groove isolation structure by the above-mentioned conventional art, the main surface of a silicon semiconductor substrate is etched to form a groove, for example, and a silicon oxide film is formed by oxidizing the surface of silicon in the groove. Then, after polysilicon is thickly deposited over the entire surface of the semiconductor substrate including the inside of said groove, the polysilicon is formatively buried in the inside of said groove formed on the main face of the semiconductor substrate by etching back said polysilicon.

Nevertheless, when a method of burying polysilicon in a groove such as the conventional art mentioned above is employed, the dielectric constant inside the groove is a large value (~11) due to said polysilicon filled therein. As a result, a parasitic capacitance produced between the isolation region and active element or the one between the isolation region and wirings becomes large so as to hinder a high-speed operation of an LSI.

In order to prevent the increase of the dielectric constant mentioned above, it may be possible to fill an insulating film having a low dielectric constant (3~4) in place of the polysilicon in the groove by chemical vapor deposition (CVD).

In the case of filling in the groove with the above-mentioned CVD insulating film, it is theoretically possible to fill completely the CVD insulating film in the groove if the CVD film having a width of more than ½ of that of the groove to be filled is deposited on the semiconductor substrate. However, since the bonding strength (adhesion) of CVD insulating films is weak as compared with polysilicon, the bonding interface of CVD insulating films deposited on both sides of the groove is exposed when the etching back is performed after the CVD insulating films are deposited as in the case of filling in polysilicon as mentioned above. Therefore, the etching proceeds easily only in the central part of the groove along said bonding interface, resulting in a defective process such that the groove cannot be buried flatly.

On the other hand, it may be possible to leave the CVD insulating film deposited on the semiconductor substrate intact without performing any etching back thereon so that the bonding interface of the CVD insulating films in the groove is not exposed. In this case, a considerably thick CVD insulating film still remains on the surface of the semiconductor substrate in the places other than the groove such as the region in which the active element is formed.

Accordingly, when the CVD insulating film is thickly deposited as in this case, there exists an disadvantage that a longer period of time is required for depositing the film. Also, it becomes difficult to produce a diffusion layer which is formed later on the main face of the semiconductor substrate as an active region or to produce a contact between a wiring layer formed on said CVD insulating film and said diffusion layer on the main surface of the semiconductor substrate when the CVD insulating film is left thickly on the semiconductor substrate as described above.

In consideration of such problems, another purpose of the present invention is to provide a manufacturing method of semiconductor integrated circuit devices capable of producing a highly reliable groove isolation structure with low dielectric constant so as to make possible the improvement of the integration as well as the simplification of the manufacturing process.

These additional purposes of the present invention and the new features thereof will be readily understood 20 from the subsequent descriptions of this specification and the accompanying drawings.

A manufacturing method of a semiconductor integrated circuit device according to the present invention herein includes the following:

(a) a first shallow groove is formed by etching the main face of the semiconductor substrate selectively in such a manner that said first shallow groove surrounds an active region in which an active element is to be formed;

(b) a second deep groove is formed by etching a part of the bottom surface of said first shallow groove selectively in such a manner that width of said second groove is narrower than width of said first groove;

(c) an insulating material is deposited by a CVD method so as to cover said main face of the semiconductor substrate including said first and second grooves to form an insulating film in said first and second grooves and on said active region; and (d) using anisotropic etching, said insulating film on said active region is removed by etching back said insulating film while said insulating film in said first and second grooves is left intact.

According to the above-mentioned manufacturing method, the second deep groove which actually is an isolation groove is left formatively at the bottom surface of the first shallow groove. Therefore, the binding (bonding) interface of insulating films formed approximately in the center of said second deep groove is not exposed at the time of etching back. As a result, an insulating film can be buried flatly in said first deep groove. Further, since the region in which an active element is produced is so formed as to project from the bottom surface of said first shallow groove because of the formation of said shallow groove, said insulating film is not left thickly on the active region. Therefore, it is not difficult to form a diffusion layer on the active region and to form a contact for connecting said diffusion layer with the wiring layer, so that the reliability of a semiconductor integrated circuit device can be improved.

A manufacturing method of a semiconductor integrated circuit devices according to the present invention will be described with reference to the drawings, in which:

FIGS. 26 to 42 are views showing cross sections of the main parts illustrating the manufacturing method of semiconductor integrated circuit devices of the embodiment.

The manufacturing processes will subsequently be described.

Figure 26:
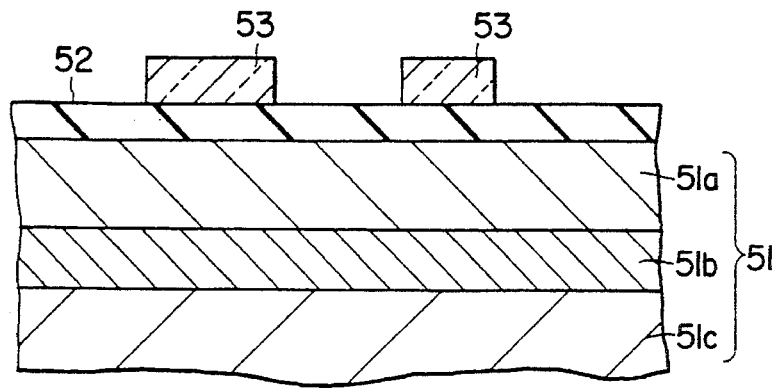
FIGS. 26 to 36 are the cross sectional views illustrating the element isolation processes of a semiconductor integrated circuit device according to the present invention.

Firstly, as shown in FIG. 26, a semiconductor substrate 51 comprising an epitaxial layer 51a of $N^-$-type monocrystalline silicon, $N^+$-buried layer 51b, and a semiconductor substrate 51c of $P^-$-type monocrystalline silicon is prepared, and on the main face of said epitaxial layer 1a, an oxide film 52 is formed. Then, a photoresist film 53 is selectively formed to cover an element formation region in which an active element is produced.

Figure 27:
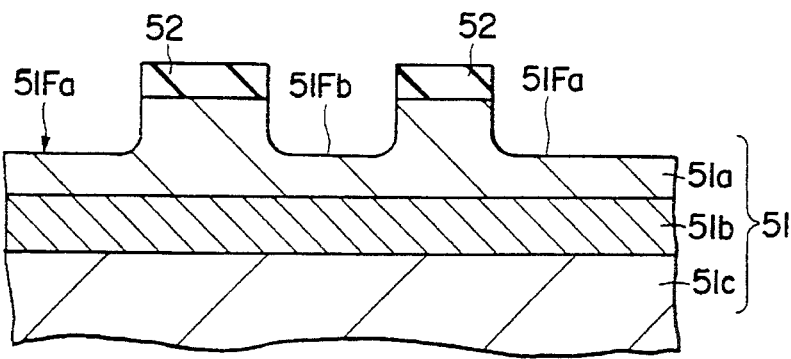

Next, as shown in FIG. 27, a patterning is performed by etching the oxide film 52 with said photoresist film 53 as an etching mask. Then, subsequently to the removal of said photoresist film 53, the semiconductor substrate 51($N^-$-type epitaxial layer 51a) is etched with said patterned oxide film 52 as an etching mask to form first shallow grooves 51Fa and 51Fb which are to serve as isolation regions.

Figure 28:
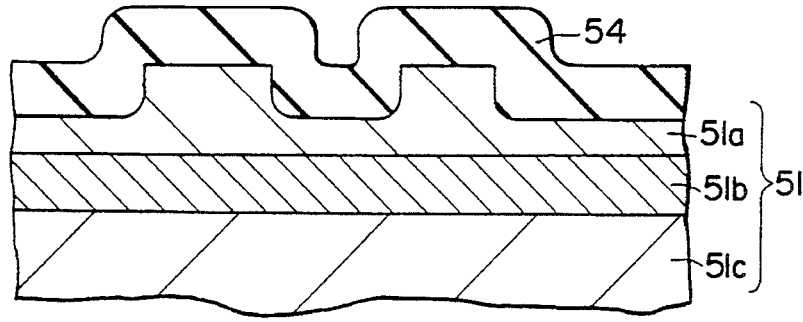

Next, as shown in FIG. 28, the oxide film 52 is removed, and insulator (insulating material) such as silicon oxide material is deposited on said semiconductor substrate 51 including said first shallow grooves 51Fa and 51Fb by a CVD method to form an insulating film 54.

Figure 29:
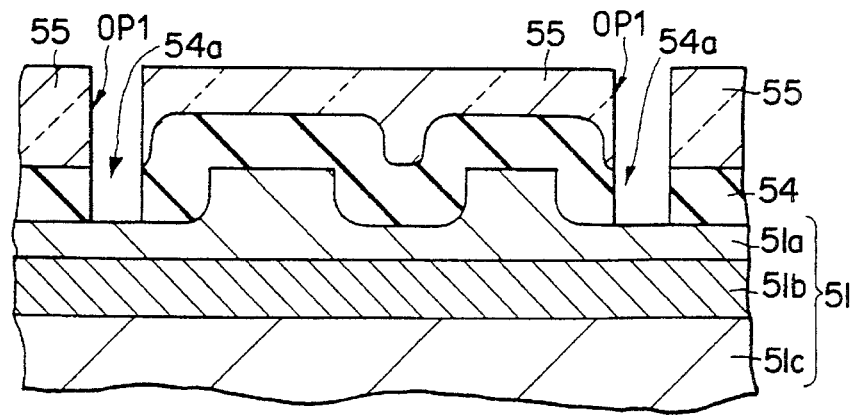

Next, as shown in FIG. 29, a photoresist film 55 is formed on said insulating film 54 to make an opening OP1 by photolithography and etching technique. The width of said opening OP1 is, for example, 1.0 μm, a minimum processing dimension of the photolithography employed in this embodiment. Then, the insulating film 54 is selectively etched with said photoresist film 55 as an etching mask to form an opening 54a of approximately 1.0 μm wide in said insulating film 52.

Figure 30:
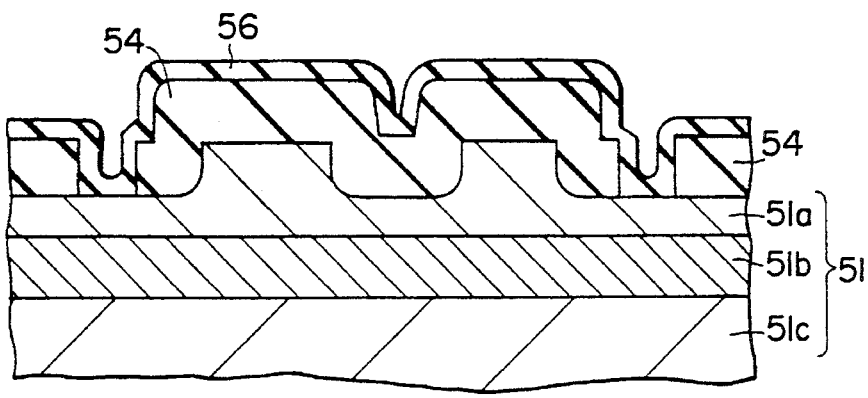

Next, subsequently to the removal of the photoresist 55, an insulating film 56 of silicon dioxide is formed on the insulating film 54 including said opening 54a as shown in FIG. 30 by the CVD method in a thickness of approximately, for example, about 0.3 μm, less than ½ of the width (1.0 μm) of said opening 4a.

Figure 31:
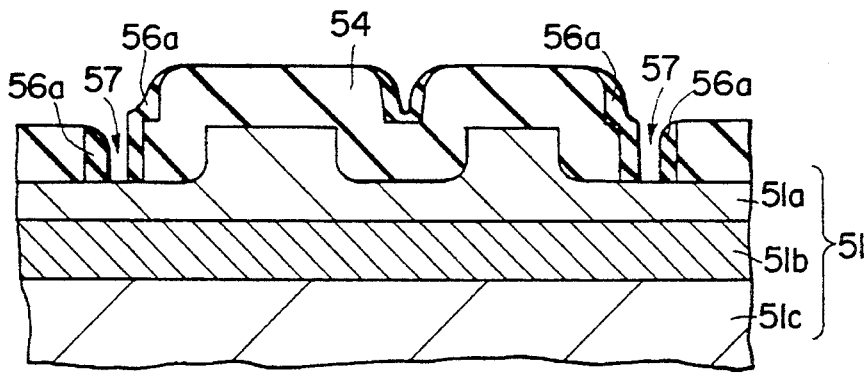

Next, as shown in FIG. 31, said insulating film 56 is processed by an anisotropic etching in the direction perpendicular to the substrate 51 to form side wall spacers 56a made of the insulating film 56 on the side walls of insulating film 54 at the opening 4a so that an opening 57 having a width of substantially less than 0.5 μm is produced. The processing of forming by side wall spacers a fine pattern which is finer than that by photolithography in this way is referred to as a side-film processing.

Figure 32:
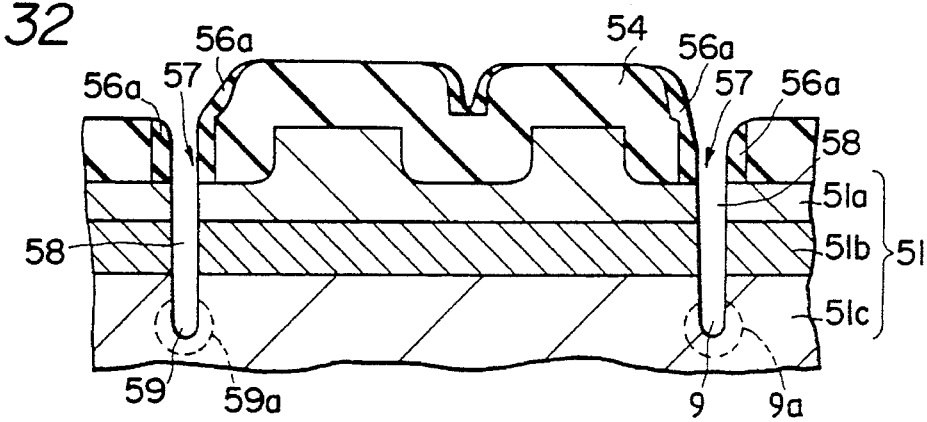

Next, as shown in FIG. 32, the substrate 51 which is exposed from said opening 57 is etched by anisotropic etching to a required depth by the use of said side wall spacers 56a and insulating film 54 as an etching mask in order to obtain the second deep groove 58 of a sub-micron width, the groove reaching the semiconductor substrate 51c. Then, at the depth surface 59 of said second deep groove 58, a p-type impurity such as boron is introduced to produce a channel stopper region 59a. Said p-type impurity is introduced by an ion implantation, for example.

Figure 33:
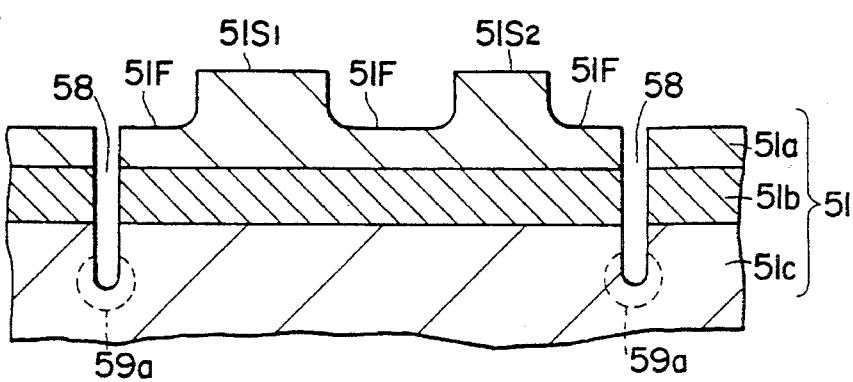

Next, as shown in FIG. 33, the CVD insulating films 54 and 56a are completely removed by wet etching, for example.

Figure 34:
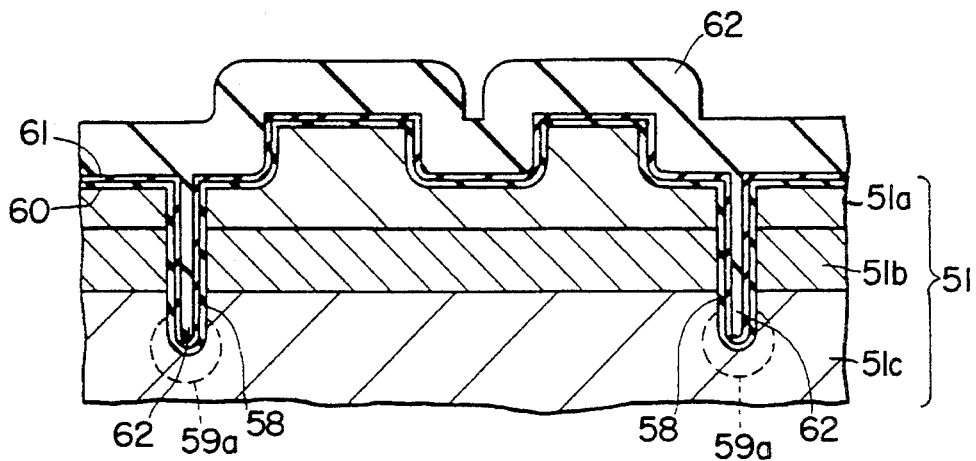

Then, as shown in FIG. 34, an insulator (CVD oxide film 62) is deposited almost in the same thickness as the depth of said first shallow grooves 51Fa and 51Fb over the entire surface of silicon substrate 51 where said second deep groove 58 is formed. Prior to the formation of the insulating film 62 in this embodiment, a silicon oxide film 60 is formed on the surface of the silicon substrate 51 as a base by thermal oxidation. Then, a silicon nitride film 61 is formed on said oxide film 60 by a CVD method, for example, in order to prevent the semiconductor substrate 51 from oxidation and stress.

Figure 35:
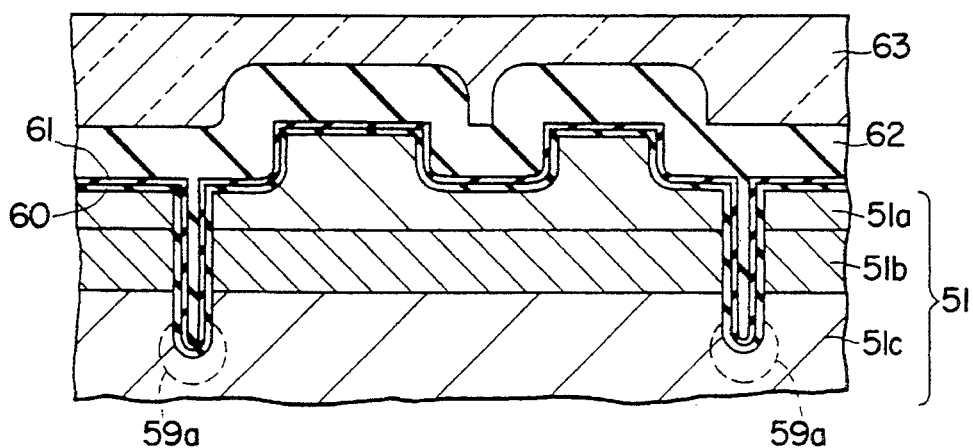

Next, as shown in FIG. 35, a resist film (organic film) 63 for flattening is formed to cover said oxide film 62 to almost eliminate the differences in level caused by the formation of said shallow grooves 51F$a$ and 51F$b$.

Figure 36:
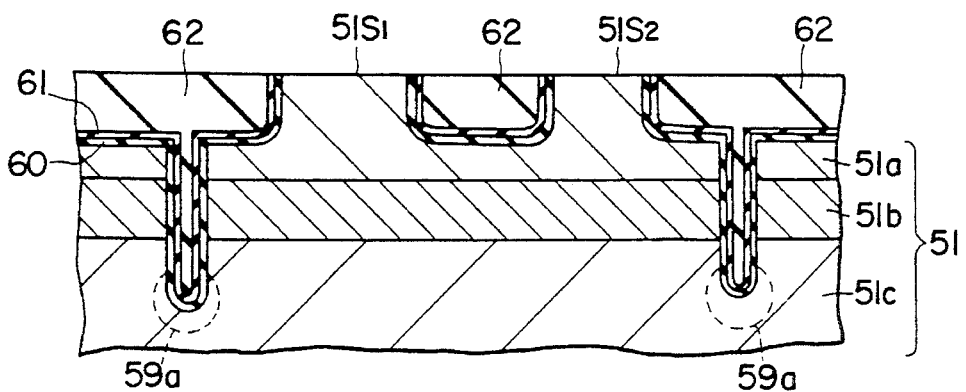

Then, as shown in FIG. 36, the resist film 63, oxide film 62, oxide film 60, and silicon nitride film 11 are etched back sequentially by anisotropic etching until the silicon substrate 51 is exposed, and the insulating film 62 is formatively buried in said second deep groove 58 and first shallow grooves 51F$a$ and 51F$b$.

As an end-point detection of said etching back, silicon of the substrate 51 is used. However, said silicon nitride film 61 can also be used as the end-point detector (etching stopper). The $51S_1$ and $51S_2$ in FIG. 36 represent the main surfaces of active regions on which active elements are actually produced.

In this way, by burying said insulating film 62 both in said second deep groove 58 and first shallow grooves 51F$a$ and 51F$b$ simultaneously, it is possible to bury said insulating film 62 flatly in the second deep groove which reaches the semiconductor substrate 1$c$ and actually becomes an isolation groove. It should be noted that the surface of said second deep groove 58 (concretely, the bottom surface of said first shallow groove 51F$a$) is not exposed when said insulating film 62 is etched back for flattening. Therefore, unlike such conventional art as previously described, the binding interface (bonding interface) of CVD insulating films themselves are not exposed. Thus, the etching proceeds along the binding interface, and the problem that the flattening is disturbed can be solved.

Next, there will be described, with reference to FIGS. 37 to 42, a method of manufacturing a bipolar transistor which is an active element produced on the main surface of the active regions $51S_1$ and $51S_2$ surrounded by the flattened isolation structure shown in FIG. 36.

Although not shown in the drawing, a high-density n-type impurity such as phosphorus (P) is introduced to the active region $51S_2$ subsequently to the process shown in FIG. 36 to form a collector leading-out region extending to said $N^+$-type buried layer 51$b$.

Said active region $51S_1$ is one in which the emitter, base and intrinsic collector regions (actually, $N^-$-type epitaxial layer 51$a$) of said bipolar transistor are formed.

FIGS. 37 to 42 are views showing only said active region $51S_1$ and illustrate mainly the manufacturing processes of forming the emitter and base regions. Said active region $51S_2$ where the collector leading region is formed is not illustrated in the drawings.

Figure 37:
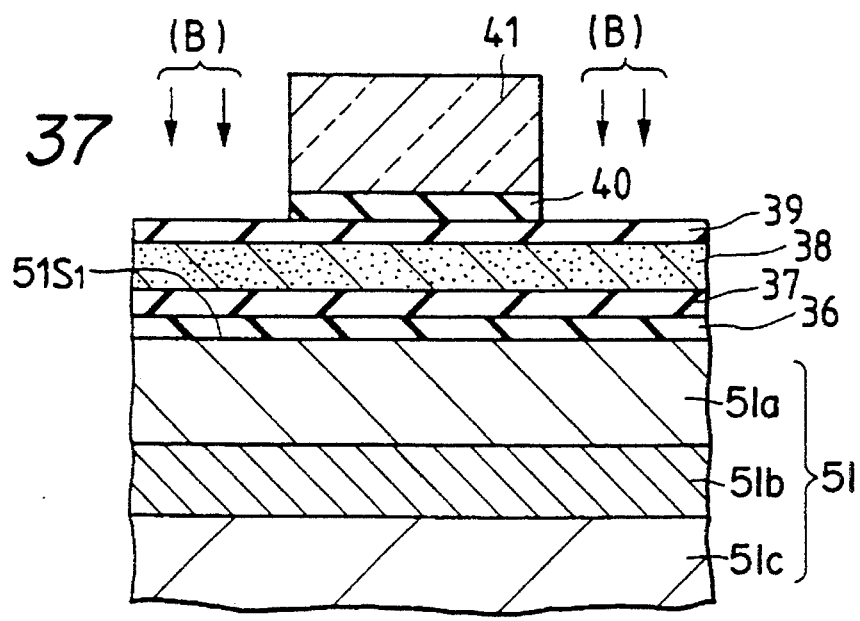
FIGS. 37 to 42 are sectional views of the main parts illustrating the manufacturing processes to form a bipolar transistor in the active region of a semiconductor integrated circuit device having the element isolation region produced by the processes shown in FIGS. 26 to 36.

First, as shown in FIG. 37, an oxide film ($SiO_2$ film) 36 is formed on the surface of the active region $51S_1$, and subsequently, a silicon nitride film 37 is deposited on the oxide film 36. Then, on the surface of said silicon nitride film 37, a non-doped polysilicon 38 is formed by a CVD method, for example. Furthermore, on its upper surface, an oxide film 39 and a silicon nitride film 40 are sequentially formed. Next, by an ordinary photolithography and etching technique the silicon nitride film 40 right under a photoresist mask 41 is selectively etched with the photoresist mask 41 as a mask. Then, p-type impurity such as boron (B) is introduced to said non-doped polysilicon 38 by ion implantation with said photoresist mask 41 as a mask for introducing impurity. The state of the substrate processed so far is shown in FIG. 37.

Figure 38:
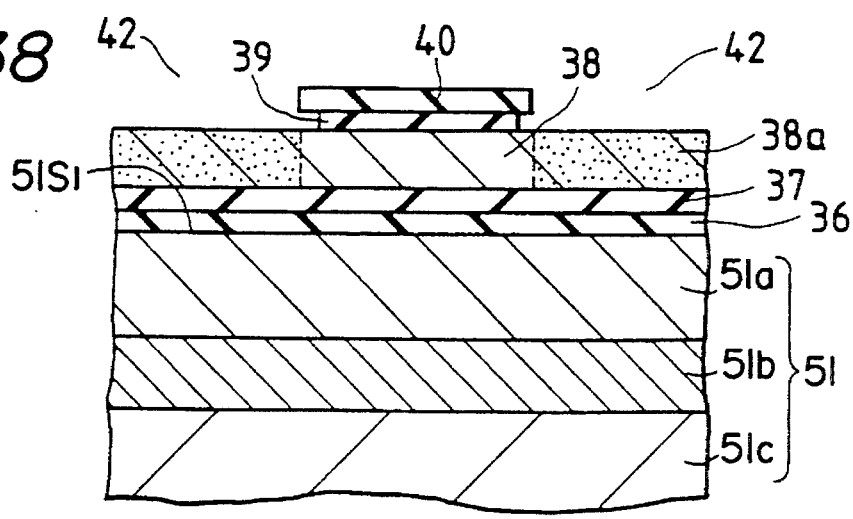

Then, the photoresist 41 is removed, and as shown in FIG. 38, said p-type impurity introduced is annealed. In this way, the outer portion of the silicon nitride film 40 becomes a boron-doped polysilicon 38$a$ (in order to distinguish it from the non-doped polysilicon 38, it is designated by 38$a$), and on the other hand, the non-doped polysilicon 38 is left intact on the lower portion of the silicon nitride film. Subsequently, said oxide Film 39 is wet-etched by, for example, an HF etching solution with the silicon nitride Film 40 as a mask. At this time, as shown in FIG. 38, the oxide Film 39 under the silicon nitride film 40 is side-etched.

Figure 39:
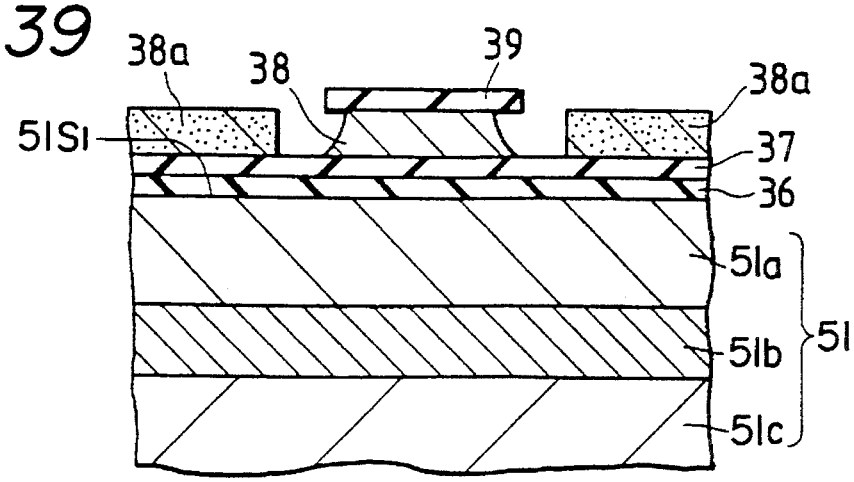

Next, subsequently to the removal of the silicon nitride Film 40 which functions as a mask, the non-doped polysilicon 38 is selectively etched by hydrazine by the use of the remaining portion of the oxide film 39 underneath the silicon nitride film as a mask as shown in FIG. 39. Thus, the silicon nitride film 37 underneath said etched non-doped polysilicon 38 is partly exposed.

Figure 40:
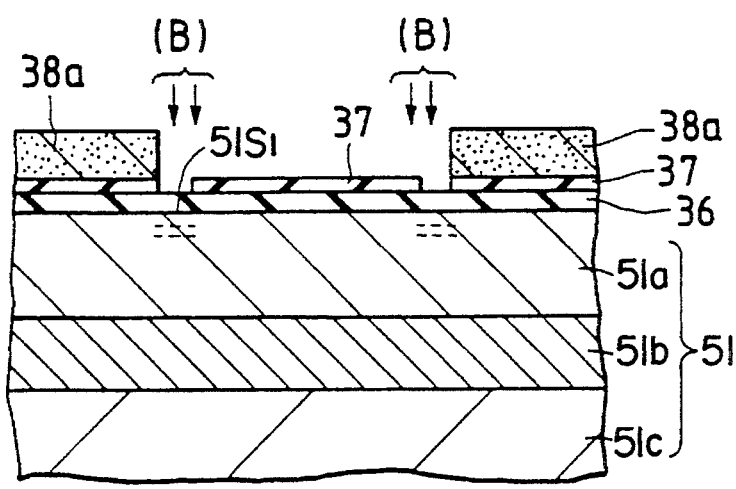
Figure 41:
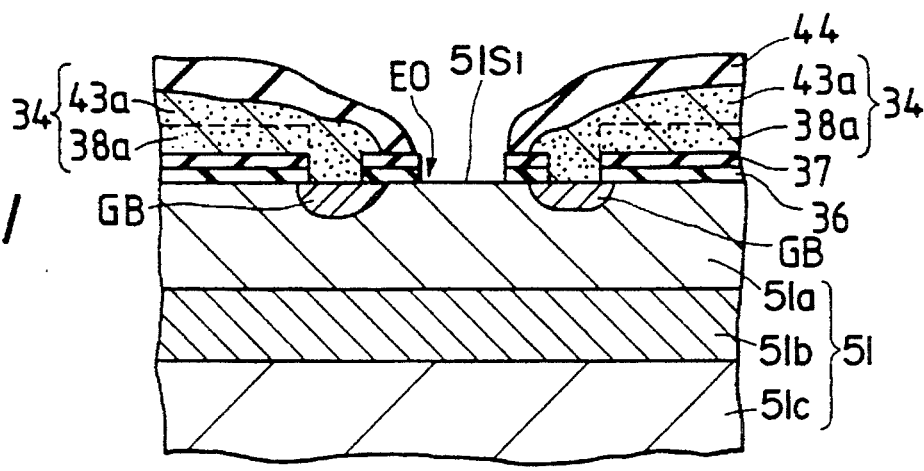

Next, the oxide film 39 used as a mask for said selective etching is removed. Then, as shown in FIG. 40, said exposed silicon nitride Film 37 is etched by the use of the non-doped polysilicon 38 and boron-doped polysilicon 38a as etching masks. After this etching process, the non-doped polysilicon 38 which has been used as a mask is removed. Subsequently, on the main face of the $N^-$-type epitaxial layer 1$a$, a p-type impurity such as boron (B) is introduced by ion implantation with said silicon nitride film 37 as a mask for introducing impurity in order to form the outer base region of a bipolar transistor. Then, the silicon oxide film 36 exposed from said silicon nitride film 37 is removed by wet etching to expose the surface of $N^-$-type epitaxial layer 1$a$. Subsequently, as shown in FIG. 41, non-doped polysilicon is deposited on the substrate 1 including said silicon nitride film 37 and annealing is carried out. As a result, diffusion (arising) of p-type impurity (boron) implanted in the boron-doped polysilicon 38$a$ and in outer base region takes place. Then, said non-doped polysilicon is converted to boron-doped polysilicon 43$a$ with the exception of the portion on said silicon nitride film 37. At this time, the outer base region GB is also formed. Subsequently, the non-doped polysilicon still remaining on said silicon nitride film 37 is selectively etched by hydrazine and the like to form a base leading electrode 34 comprising boron-doped polysilicon 38$a$ and 43$a$.

After that, the surface of boron-doped polysilicon 43$a$ is oxidized by thermal oxidation to form an oxide film 44. Then, with this oxide film as an etching mask, the silicon nitride film 37 and oxide film 36 inside the emitter opening EO are removed by etching.

Figure 42:
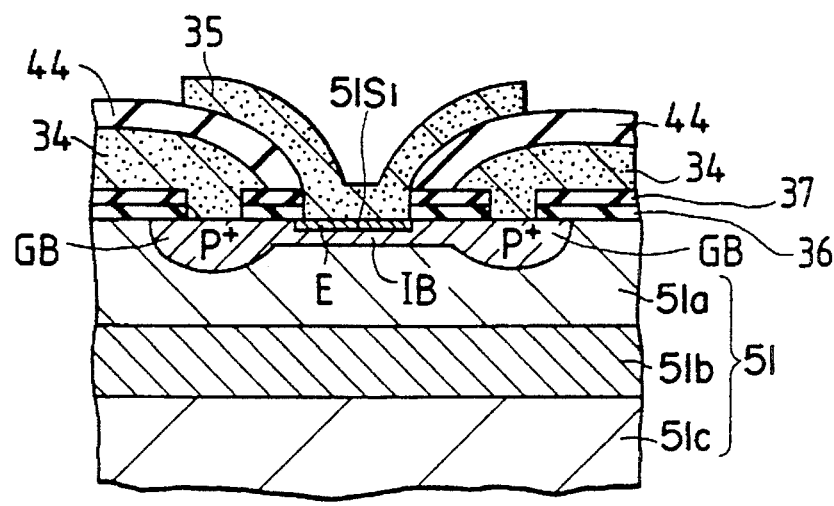

Next, as shown in FIG. 42, polysilicon is formed as an emitter leading electrode 35 in such a manner that the polysilicon is in contact with the $N^-$-type epitaxial layer 1a exposed by the emitter opening EO, and in said emitter leading electrode 35, p-type and n-type impurities are introduced sequentially in order to form an intrinsic base region IB and an emitter region E by thermal diffusion. Thus, an NPN bipolar transistor having the n-type emitter region E, p-type intrinsic base region IB and intrinsic collector region (the $N^-$-type epitaxial layer 51$a$), as its main operational regions, is produced almost completely.

Next, there will be specifically described the functional effect of an isolation structure such that said isolation groove according to the present invention described with reference to FIGS. 26 to 36 has the width of 0.5 μm or less and is buried with the CVD insulating film. Hereinafter the isolation groove according to the present invention will be referred to as a U-shaped groove.

Firstly, since the width of the U-shaped groove according to the present invention is 0.5 μm or less, the required thickness of a CVD insulating film itself can be thin for burying the U-shaped groove. In other words, according to conventional technologies, it is required to deposit the CVD insulating film thickly, say as much as 3 μm, to bury the CVD insulating film in the U-shaped groove of, for example, 1 μm width, so as to avoid concavities. On the contrary, there occurs almost no concavity when the sub-micron U-shaped groove is buried according to the present invention. Though the thickness of the deposited film is thin, a required flatness can be obtained. Also, because of the thin CVD insulating film, the time required for depositing it can be reduced significantly.

Here, the items which the present inventor and others studied with respect to the relationship between the flatness d, which represents the degree of concavity appearing on the U-shaped groove, and the width W of the U-shaped groove will subsequently be described.

Figure 43:
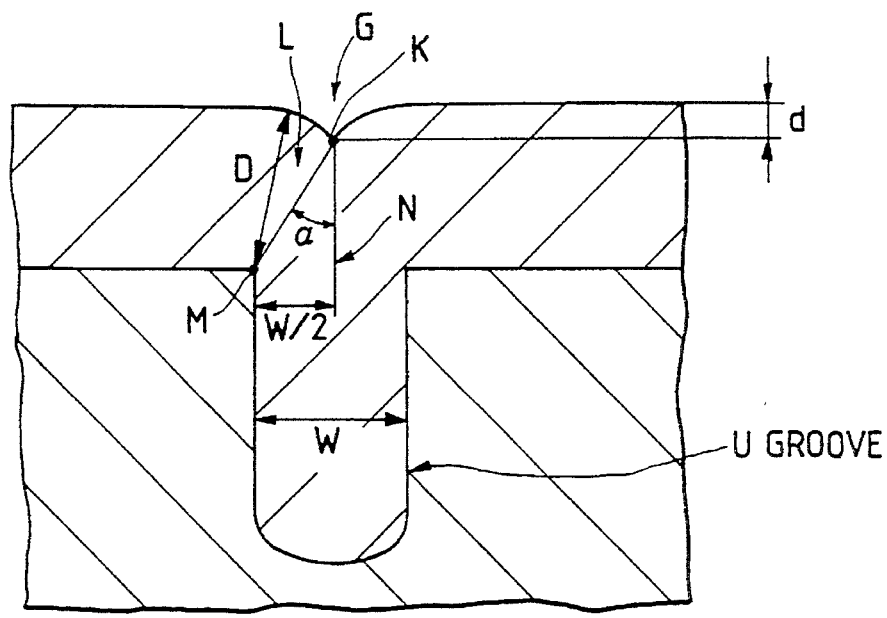
FIG. 43 is a sectional view of the main part illustrating the relationship between the width W of U-shaped groove and the flatness d in accordance with examination by the present inventor and others.

FIG. 43 is a view showing a state that a CVD insulating film having a thickness D is deposited in the U-shaped groove having the width W. Assuming that the angle made by a straight line L, which connects the deepest point K of the concavity G in the CVD insulating film formed on the U-shaped groove with the shoulder point M of the groove, and the perpendicular N is α, the flatness d (the distance from the flat surface of the insulating film to the deepest point K) can be expressed by the following equation (1):

$$d = D(1 - \cos\alpha) \approx \frac{\alpha^2}{2} \quad (1)$$

Since the angle α can be expressed by the following equation:

$$\alpha \approx \frac{W/2}{8D}$$

Then, substituting the angle α for the equation (1), the following expression (2) can be obtained:

$$d \approx \frac{W^2}{8D} \quad (2)$$

Therefore, since the flatness d varies obviously in the second powers of the width W of the groove, the flatness can be improved rapidly if the width W of the groove is made narrower. Now, provided that the CVD insulating film is deposited in the thickness of 1.0 μm in the sub-micron U-shaped groove (the width W of the groove=0.2 μm) as an assumption, the flatness d≈0.005 μm according to the above-mentioned equation (2).

Figure 44:
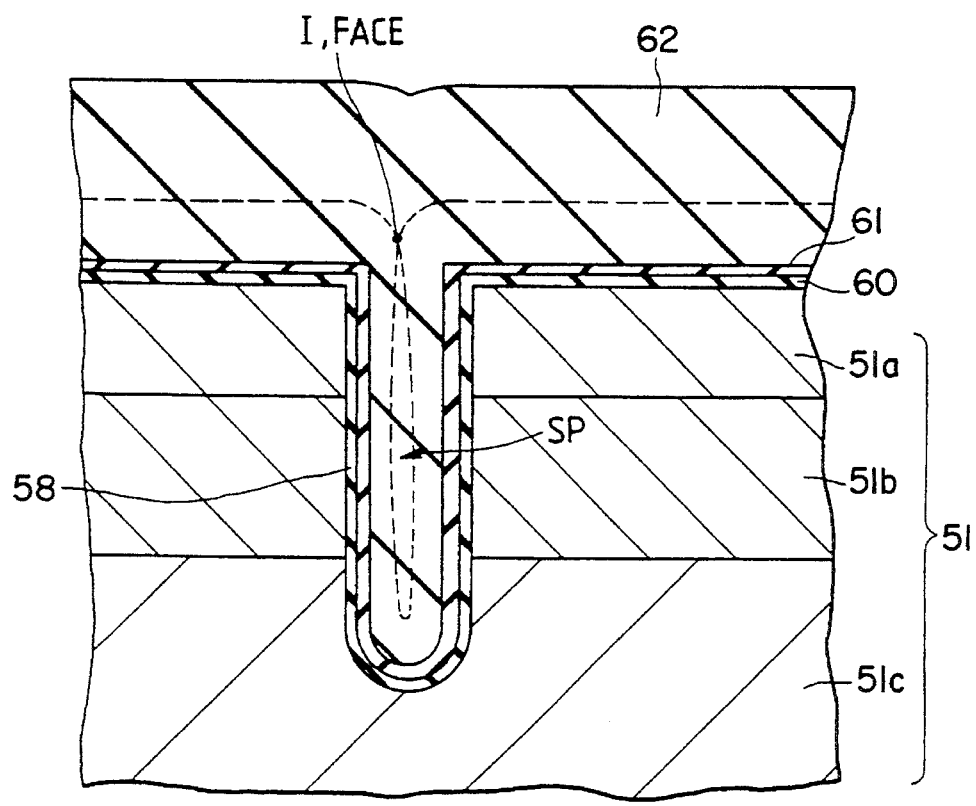
FIG. 44 is a longitudinally sectional view illustrating the state of an insulator deposited in the sub-micron U-shaped groove according to the present invention.

Secondly, as shown in FIG. 44, according to the present invention, no etching back is required for the insulating film filled in the U-shaped groove, or the amount of etching back is extremely small. Therefore, there is no fear that the binding interface (bonding interface) I, Face of buried CVD insulating films are exposed. As a result, not only failures such as over etching along said interface I, Face can be prevented, but also a hollow space SP formed in the U-shaped groove can be utilized positively for stress relaxation.

Thirdly, in a semiconductor integrated circuit device (bipolar transistor) having shallow grooves on a silicon substrate 51, as shown by this embodiment, an insulator can be filled both in the shallow grooves and deep U-shaped groove simultaneously. As a result, the manufacturing processes of integrated circuit devices can be simplified.

With the process thus simplified, the thicknesses of isolation films in a wafer become more uniform.

Now, specifically, assuming that the thickness variation of the deposited polysilicon is 5% and its etching back variation is also 5% in a conventional groove isolation using polysilicon, and that the thickness of the polysilicon is 4 μm and the amount of etching back is 3 μm, an error of 0.25 μm ($=\sqrt{(4 \mu m \times 5\%)^2 + (3 \mu m \times 5\%)^2}$) results. On the other hand, according to the U-shaped groove isolation of the present invention, the resultant uniformity in a wafer is significantly superior to that conventionally obtainable, because the error caused by the variations of the CVD insulating film (1 μm) at the time of its formation is only 0.05 μm.

Figure 45:
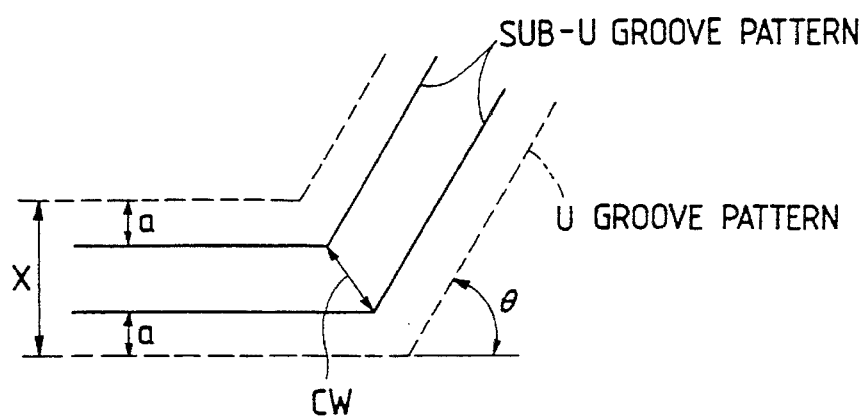
FIG. 45 is a plane view illustrating the relationship between the bending angle θ at the corner of the U-shaped groove pattern and the expansion effect of the width of groove according to the examination by the present inventor.

Also, from the studies by the present inventor, it is found that the width of groove at the corner of plane pattern of U-shaped groove is increased when the U-shaped groove is formed to surround the active region on a silicon substrate. In other words, as shown in FIG. 45, the increase of the width CW of the groove at this corner depends on the bending angle θ, and the rate Y of increase of the width of groove can be represented in the following expression with the bending angle θ as a parameter (the greater the rate Y, the greater the expansion effect of the width of groove):

$$Y = \frac{(X-a)\sec\theta/2 - a}{X - 2a} \quad (3)$$

Where X is the width of groove prior to the execution of said side film processing; a is the thickness of the side wall spacer 56a. Formed by said side film processing; and (X−2a) corresponds to the width W of groove of the sub-micron U-shaped groove obtained after the super-miniaturization.

As readily understandable form said expression (3), the smaller the bending angle θ at the corner, the lesser the expansion effect of the width of groove.

Therefore, in this embodiment, the layout of a photoresist For processing the U-shaped groove is of an octagon loop isolation pattern with small bending angles θ in order to prevent the degradation of the Flatness due to the expansion effect of the width of groove upon filling the groove.

Figure 46:
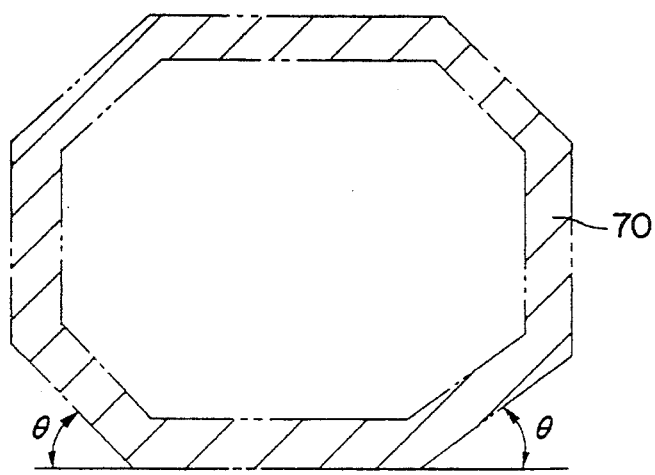
FIG. 46 is a plane view showing the photomask for a sub-micron U-shaped groove pattern.

FIG. 46 is a plane layout view showing said octagon loop pattern of the U-shaped groove pattern. The bending angles θ at the corners of the U-shaped groove pattern 70 are all 45°, and the expansion effect of the width of groove at every corner is equally reduced.

Figure 47:
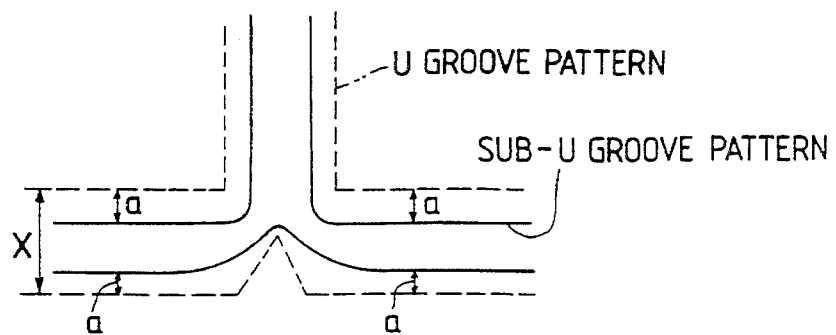
FIG. 47 is a plane view showing the photomask of the U-shaped groove pattern to weaken the expansion effect of the width of groove at the T-shaped intersection according to the examination by the present inventor and others.

Also, the expansion effect of the width of groove at T-shaped intersections of a photo-mask For the U-shaped groove pattern can be weakened by Forming a pattern such as shown in FIG. 47.

Figure 48:
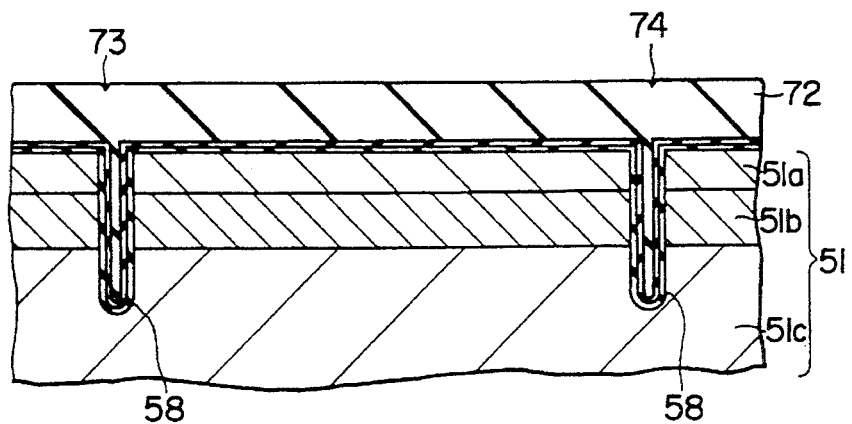
FIG. 48 is a sectional view showing an example in which an isolation according to the present invention is applied to a semiconductor in integrated circuit device without shallow grooves.

FIG. 48 is a view showing the cross section of another embodiment in which an isolation according to the present invention is arranged on a silicon substrate without any shallow grooves. In this case, the concavities 73 and 74 on the U-shaped groove are so small that they can be neglected (the flatness d is 0.005 μm according to said expression (2) provided that the insulating film 62 is 1 μm and the width of the groove, 0.2 μm). Therefore, there is almost no need for an etching back process to thin the film.

Figure 49:
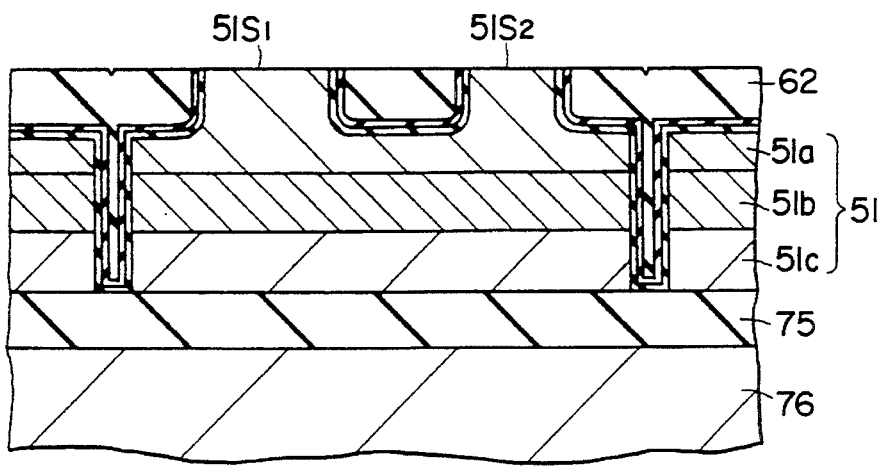
FIG. 49 is a sectional view showing an example in which an isolation according to the present invention is applied to a semiconductor integrated circuit device using an SOI substrate.
Figure 50:
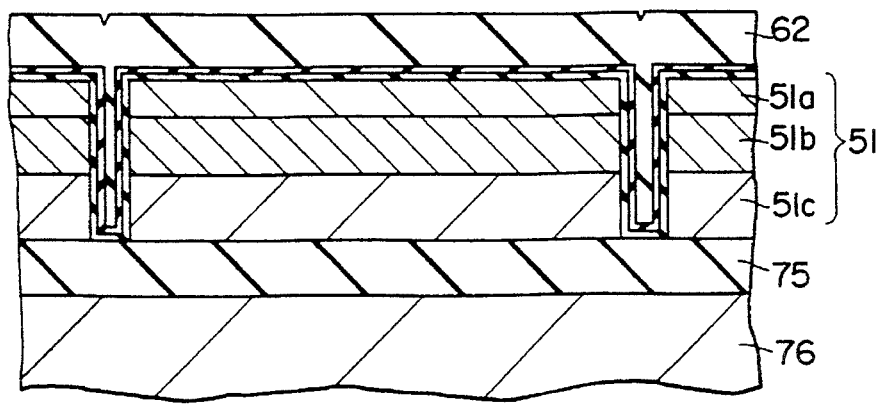
FIG. 50 is a longitudinally sectional view showing an example in which an isolation according to the present invention is applied to a semiconductor integrated circuit device using an SOI substrate without shallow grooves.

FIGS. 49 and 50 are views showing an embodiment in which a U-shaped groove isolation according to the present invention is applied to an SOI (Silicon On Insulator) substrate comprising silicon substrate —oxide film—silicon substrate. This embodiment is also capable of obtaining exactly the same effect of the embodiments shown respectively in FIGS. 26 to 36 and FIG. 48. Thus, the isolation according to the present invention is particularly effective for the semiconductor integrated circuit devices using SOI substrates or SOS (Silicon On Sapphire) substrates whose manufacturing processes are more complicated.

Numeral 75 is an oxide film and 76 is a silicon substrate in FIGS. 49 and 50.

In this embodiment, the sub-micron U-shaped groove pattern is achieved by forming side wall spacers in the walls of U-shaped groove pattern of 1 μm groove width. However, the method is not limited to this one. For example, a sub-micron U-shaped groove pattern can also be produced in such a manner that the non-doped polysilicon is deposited on a CVD oxide film deposited on a silicon substrate, boron is subsequently introduced into the non-doped silicon with the U-shaped groove of 1 μm groove width as a mask, said boron introduced in the polysilicon is diffused in the lateral direction by annealing, and the sub-micron U-shaped groove pattern is formed by etching the non-doped polysilicon portion.

Although the invention made by the present inventor has been described specifically according to the embodiments as set forth above, this invention is not limited to the above-mentioned embodiments, and various modifications are obviously possible within the scope without departing the purport thereof.

The effect obtained by the typical inventions among those disclosed in this application will subsequently be described.

With the manufacturing method of semiconductor integrated circuit devices according to the present invention, the isolation between the elements in a semiconductor integrated circuit is provided by a U-shaped groove having a width of groove of 0.5 μm or less, and an insulator is filled in the inside of said U-shaped groove. Therefore, the dielectric constant of the isolation in the semiconductor integrated circuit is small, so that a low capacitance can be achieved. Also, with the short isolation distance between elements, finer pattern and higher integration of an integrated circuit can be achieved simultaneously.

Furthermore, when the U-shaped groove is filled with the deposited CVD insulating film, the manufacturing process can be simplified because the flattening is possible by a thin CVD insulating film. Also, when this invention is applied to a bipolar transistor with double-polysilicon structure of self-aligning type which has a shallow groove, a U-shaped groove is formed in the shallow groove so as to fill said shallow grooves and U-shaped groove simultaneously. In this way, the manufacturing processes can be further simplified.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor integrated circuit device comprising:

(a) a semiconductor body having a main surface;

(b) a first semiconductor layer of a first conductivity type formed at said main surface of said semiconductor body, said first semiconductor layer being used as a collector region of a bipolar transistor;

(c) a field oxide film which is selectively formed on a surface of said first semiconductor layer and which surrounds an active region of said surface of said first semiconductor layer in which base and emitter regions of said bipolar transistor are to be formed, said field oxide film having first substantially parallel edges and second substantially parallel edges which are perpendicular to said first substantially parallel edges, said active region having a substantially rectangular plane figure which is defined by said first and second substantially parallel edges;

(d) a second semiconductor layer of a second conductivity type opposite to said first conductivity type which is formed at said active region of said surface of said first semiconductor layer and which is used as said base region of said bipolar transistor;

(e) a base lead-out electrode of said bipolar transistor partially overlying said active region and extending on said field oxide film, said base lead-out electrode contacting a periphery of said second semiconductor layer and surrounding an emitter forming region of said bipolar transistor, said base lead-out electrode having first inner edges and second inner edges which respectively oppose said first and second substantially parallel edges of said field oxide film, the distance between said first inner edges and said first substantially parallel edges being substantially the same as that between said second inner edges and said second substantially parallel edges;

(f) a third semiconductor layer of said first conductivity type which is formed in said emitter forming region at said active region and which is used as said emitter region of said bipolar transistor;

(g) an emitter electrode of said bipolar transistor which is formed over said emitter region;

(h) a base electrode of said bipolar transistor which is formed on said base lead-out electrode over said field oxide film; and (i) a collector electrode of said bipolar transistor formed on said surface of said first semiconductor layer which is outside of said active region;

wherein said field oxide film is formed so as to cut off the corners of said active region defined by intersections of said first and second substantially parallel edges to form slanted edges in place of each of said corners of said active region, so that the distance between each of the slanted edges of said active region and each of the corners of said base lead-out electrode defined by intersections of said first and second inner edges is substantially the same as the distance between each of said first and second inner edges and each of said first and second substantially parallel edges, thereby reducing an area of said active region in which said base lead-out electrode is overlapped.

2. A semiconductor integrated circuit device according to claim 1, wherein said second semiconductor layer of said base region of said bipolar transistor includes an intrinsic base region and an extrinsic base region surrounding said intrinsic base region, and wherein said base lead-out electrode electrically contacts with said extrinsic base region.

3. A semiconductor integrated circuit device according to claim 2, wherein said base lead-out electrode comprises a polycrystalline silicon layer which is doped with impurities of said second conductivity type, and wherein said extrinsic base region is formed by introducing a part of said impurities of said second conductivity type into said surface of said first semiconductor layer.

4. A semiconductor integrated circuit device according to claim 1, further comprising a thin oxide film formed between said base lead-out electrode and said active region of said surface of said first semiconductor layer, wherein said field oxide film is formed so as to cut off the corners of said active region in order to reduce MIS capacitance between said base lead-out electrode and said first semiconductor layer.

5. A semiconductor integrated circuit device according to claim 4, wherein said base lead-out electrode is electrically connected with said second semiconductor layer of said base region via a contact hole formed in said thin oxide film.

6. A semiconductor integrated circuit device according to claim 1, wherein said semiconductor body includes a semiconductor substrate of said second conductivity type and an epitaxial semiconductor layer of said first conductivity type formed on said semiconductor substrate, and wherein said first semiconductor layer comprises said epitaxial semiconductor layer of said first conductivity type.

7. A semiconductor integrated circuit device according to claim 6, further comprising a buried semiconductor layer of said first conductivity type formed at the junction between said semiconductor substrate and said epitaxial semiconductor layer, wherein said collector region of said bipolar transistor comprises said first semiconductor layer and said buried semiconductor layer.

* * * * *